US012628456B2

(12) United States Patent
Delga et al.

(10) Patent No.: US 12,628,456 B2
(45) Date of Patent: May 12, 2026

(54) INTEGRATION OF A DETECTION CIRCUIT BASED ON OPTICAL RESONATORS INTERCONNECTED ON A READOUT CIRCUIT OF AN IMAGER

(71) Applicants: THALES, Courbevoie (FR); COMMISSARIAT A L'ENERGIE ATOMIQUE ET AUX ENERGIES ALTERNATIVES, Paris (FR)

(72) Inventors: Alexandre Delga, Palaiseau (FR); Roch Espiau De Lamaestre, Grenoble (FR)

(73) Assignees: THALES, Courbevoie (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 304 days.

(21) Appl. No.: 18/269,406

(22) PCT Filed: Dec. 21, 2021

(86) PCT No.: PCT/EP2021/087001
§ 371 (c)(1),
(2) Date: Jun. 23, 2023

(87) PCT Pub. No.: WO2022/136376
PCT Pub. Date: Jun. 30, 2022

(65) Prior Publication Data
US 2024/0321925 A1 Sep. 26, 2024

(30) Foreign Application Priority Data
Dec. 23, 2020 (FR) ...................................... 2014012

(51) Int. Cl.
*H10F 39/00* (2025.01)
*H10F 39/12* (2025.01)

(52) U.S. Cl.
CPC ......... *H10F 39/809* (2025.01); *H10F 39/018* (2025.01); *H10F 39/802* (2025.01);
(Continued)

(58) Field of Classification Search
CPC .... H10F 39/809; H10F 39/018; H10F 39/802; H10F 39/806; H10F 39/811;
(Continued)

(56) References Cited

U.S. PATENT DOCUMENTS 5,773,831 A      6/1998 Brouns
6,157,042 A  *  12/2000 Dodd ..................... B82Y 20/00
                                                  257/E27.137
(Continued)

FOREIGN PATENT DOCUMENTS

EP        3 084 843 A1     10/2016
WO        2015/091709 A1    6/2015
WO        2019/025342 A1    2/2019

OTHER PUBLICATIONS

Chen et al., "Design of a Thermal Sensitive MEMS Resonator and Readout Circuit for Infrared Sensing", 2015, 10th International Microsystems, Packaging, Assembly and Circuits Technology Conference (IMPACT), pp. 332-335 (Year: 2015).*

*Primary Examiner* — Albert H Cutler
(74) *Attorney, Agent, or Firm* — BakerHostetler

(57) ABSTRACT

An optoelectronic device includes at least one pixel comprising: a plurality of optical resonators, each optical resonator comprising a photodetecting structure confined between a first reflective metal layer and a second metal layer; and a connection microstructure that is arranged on a support made of dielectric material and is configured to electrically interconnect the second metal layers of the optical resonators belonging to the same pixel; and a readout integrated circuit arranged on a substrate and assembled with the pixel; the readout circuit comprising a buried
(Continued)

readout electrode associated with the pixel and a metal or dielectric outer layer. The assembly comprising at least the first metal layer and the outer layer of the readout integrated circuit is called a planar assembly structure. The second metal layers of the resonators of a pixel are connected to the associated readout electrode by way of a metal via connected to the connection microstructure and passing through the support.

19 Claims, 16 Drawing Sheets

(52) U.S. Cl.
CPC ......... *H10F 39/806* (2025.01); *H10F 39/811* (2025.01); *H10F 39/1935* (2025.01)

(58) Field of Classification Search
CPC .. H10F 39/1935; H10F 30/10; H10F 30/2215; H10F 39/021; H10F 77/1433; H10F 77/20; H10F 77/206; H10F 77/413; H10F 77/933
See application file for complete search history.

(56) References Cited

U.S. PATENT DOCUMENTS

2011/0156194  A1      6/2011  Gravrand et al.
2013/0320470  A1*  12/2013  Nakajima  ............... H10F 77/14
                                                              257/431

* cited by examiner

INTEGRATION OF A DETECTION CIRCUIT BASED ON OPTICAL RESONATORS INTERCONNECTED ON A READOUT CIRCUIT OF AN IMAGER

CROSS-REFERENCE TO RELATED APPLICATIONS

This application is a National Stage of International patent application PCT/EP2021/087001, filed on Dec. 21, 2021, which claims priority to foreign French patent application No. FR 2014012, filed on Dec. 23, 2020, the disclosures of which are incorporated by reference in their entireties.

FIELD OF THE INVENTION

The invention relates to hybrid systems, that is to say systems formed of two separate parts that are assembled by an assembly layer, each part being made of a different material. These systems may be optical, electronic or optoelectronic depending on the features of the assembled parts. The invention relates in particular to the integration of a plurality of metal-insulator-metal optical resonators on a readout integrated circuit for a matrix image sensor in the infrared region. The matrix imager is formed of a plurality of pixels, and each pixel comprises a plurality of interconnected optical resonators.

BACKGROUND

Hybrid systems make it possible to combine two functionalities implemented in different materials. These are for example:

a detector, in which the sensitive part is associated with a readout circuit that makes it possible to collect and process the signal to be detected, a display, for example a light-emitting display, in which the emitting part is associated with a circuit for generating electrical signals suitable for emission, a photonic circuit, with laser emitters associated with layers for processing the emitted beams (guidance, multiplexing/demultiplexing, amplification, etc.), the one or more processing layers being deposited on a silicon substrate ("Photonic on Silicon"), an electronic circuit with fast transistors or power transistors associated with a control system.

The first two hybrid systems may be described as optoelectronic, the third may be purely optical or optoelectronic, while the fourth is purely electronic.

More specifically, the technical field in question is that of the production of hybrid optoelectronic systems, comprising:

an optical part based on at least one photosensitive element for generating electric charge carriers from incident photons (for example a matrix of bolometers, photodiodes or photoconductors);

and an electronic part consisting of a readout integrated circuit on a semiconductor substrate for individually reading the signal from each pixel of the optical part. A pixel belonging to the optoelectronic system may contain a single photosensitive element or a plurality of interconnected photosensitive elements.

There are some imager technologies in which the photosensitive layer consists of a first family of semiconductor materials and the readout integrated circuit is formed in a substrate of a second family of semiconductor materials different from the first. The photodetectors are produced using III-V semiconductor materials such as gallium arsenide, indium arsenide, gallium nitride, gallium antimonide and boron phosphide. The photodetectors may also be produced using II-VI semiconductor materials. To build a hybrid system, it is necessary to assemble the photodetectors and to interconnect them with the readout integrated circuit on a silicon substrate.

FIG. 1 illustrates a partial sectional view of a hybrid optoelectronic system according to the prior art, having an optical part comprising a metal diffraction grating behind each pixel.

The optoelectronic device Dis1 illustrated in FIG. 1 is a vertical-transport infrared imager. It consists of an optical part OPT_D1 comprising at least one pixel Pxl_D1 and of an electronic part consisting of a readout integrated circuit ROIC_D1 comprising at least one buried electrode EL_D1.

The readout integrated circuit ROIC_D1 is formed by a plurality of transistors and thin layers of conductive, semiconductor or dielectric CMOS-technology (Complementary Metal-Oxide-Semiconductor) material on a silicon substrate. A buried electrode EL_D1 is associated with each pixel Pxl_D1 in order to read the signals generated by the photo charge carriers generated by the photodetecting structure of a pixel Pxl_D1.

With regard to the optical part of the device, this comprises a plurality of layers C1, C2, C3, with C1 and C3 being two conductive layers obtained by N+-doping a III-V (or II-VI) semiconductor material, and C2 being a semiconductor layer (C2 possibly being a stack of layers of III-V (or II-VI) semiconductor materials that is confined between the layers C1 and C3). The layer C2 acts as the photodetecting structure of the pixel Pxl_D1. A metal layer CM is deposited on the conductive layer C3 so as to form an upper metal contact that is associated exclusively with each pixel. The structuring of the interface C3/CM defines a diffraction grating. Each pixel of the optical part OPT_D1 is separated from an adjacent pixel of the matrix detector by way of a barrier made of dielectric material BMD. The lower layer C1 is common to a plurality of pixels and is connected to the electrical potential VINF representing an electrical ground for the entire device Dis1.

In the device Dis1, the metal layer C1 is a transparent (or poorly absorbing) conductor that allows light to pass. This makes it impossible to introduce a MIM (Metal-Insulator-Metal) structure because it is necessary to have, in the MIM structure, a layer C1 that is opaque to incident light.

In the context of the description of the invention, hybridization is understood to mean the set of specific operations and techniques for combining two parts having different functions (for example, the readout circuit ROIC_D1 and the photodetecting matrix OPT_D1). The hybridization of an optoelectronic system leads to the following interdependent technological problems:

mechanically assembling the optical part and the electronic part without affecting the optical and/or electrical performance of the hybrid device pixelation, consisting in creating the pixels and creating individualized access to the signal generated by each of the pixels of the matrix of the optical part.

interconnection, consisting in creating an electrical interconnection architecture between each of the pixels Pxl_D1 and the readout electrode associated with said pixel.

In the case of the architecture described in FIG. 1, hybridization is achieved for each pixel by way of a metal ball B1 that electrically connects the readout electrode EL_D1 to the metal layer CM forming the upper metal contact associated exclusively with the same pixel. The ball B1 may for example be implemented with indium balls or copper micro-pillars that allow each pixel to have individualized contact with the readout circuit ROIC. It is then necessary to close the electrical circuit by a common contact on the front face of the photodetector, which the incident flux necessarily has to pass through. Indeed, the layer C1 is necessarily transparent (or weakly absorbent) to the optics on the side of the detected incident wave. This makes it technically impossible to integrate MIM resonators into the device according to the prior art.

FIGS. 2a and 2b illustrate two examples of MIM (Metal/Insulator/Metal) optical resonators RO. It is possible to produce an optical nanoresonator via a microstructure comprising a photodetecting structure SPD made of a semiconductor material SC1, a first reflective metal layer M1 acting as mirror and a second upper metal layer M2 acting as sub-wavelength antenna radiating element. The photodetecting structure PD is confined between the reflective metal layer M1 and the upper metal layer M2.

The technical solutions according to the prior art of the methods of pixelation, assembly and interconnection on a readout circuit are not applicable to an optoelectronic system based on MIM optical resonator technology, because of the presence of the metal reflector on the non-incident face. The problem that arises for using such technology is as follows: either the incident face is on the common mirror side, which is not possible because it is opaque, or the incident face is on the side of the upper metal layer M2, but in this case the interconnection becomes unachievable with the device architectures according to the prior art.

The invention proposes a pixel structure formed by a plurality of optical resonators interconnected by way of a connection microstructure to solve the problems of pixelation, assembly and interconnection of an optoelectronic device comprising at least one pixel comprising resonators connected to a single buried readout electrode of the readout integrated circuit.

American patent application US 1998 5773831A describes an infrared image detector comprising a plurality of optical resonators that form the detection matrix. The drawback of the solution described by that application is that the photodetecting layer covers the entire surface of the detection matrix, thus increasing the generation of unwanted dark noise and/or current.

American patent application US 2011 0156194A1 describes an infrared image detector comprising a plurality of optical resonators that form the detection matrix. The connection between a pixel and the readout circuit is made by way of a structure in the form of a nail connected to a metal ball. The drawback of the solution described by that application is that the interconnection structure comprising metal balls has a physical limit to the increase in resolution, given the size of the metal interconnection balls. In addition, the photodetecting layer covers the entire surface of the detection matrix, thus increasing the generation of unwanted dark noise and/or current. Another drawback is additionally cited, related to the drop in optical performance, since photons incident on the contact region will not be collected, resulting in a loss of quantum efficiency of the detector according to the prior art.

Response to the Problem and Provision of a Solution

To overcome the limitations of existing solutions with regard to the pixelation, the assembly and the interconnection of an optoelectronic device comprising at least one optical resonator connected to a single readout electrode of a readout integrated circuit, the invention proposes multiple embodiments of a pixel structure comprising a plurality of interconnected optical resonators based on MIM technology; the pixel structure according to the invention is compatible with a hybrid optoelectronic system. The invention furthermore proposes manufacturing processes for implementing the various embodiments of the invention. The processes proposed by the invention relate to processes that are compatible with a silicon production line for CMOS technology and processes for manufacturing wafers based on III-V or II-VI semiconductors. Advantageously, the technical solution according to the invention makes it possible to achieve hybridization of matrix detectors in the field of infrared imaging (wavelength from 1 μm to 70 μm, therefore including THz), and in particular the MWIR (mid-wave infrared, 3-5 μm) and LWIR (long-wave infrared, 8-12 μm) spectra for thermal imaging. The architecture proposed by the invention makes it possible to improve the performance of this type of device, since the hybridization of the system is adapted to the technical constraints of MIM optical nanoresonators.

SUMMARY OF THE INVENTION

One subject of the invention is an optoelectronic device comprising:
at least one pixel, a pixel comprising:
a plurality of optical resonators, each optical resonator comprising a photodetecting structure confined between a first reflective metal layer and a second metal layer;
and a connection microstructure that is arranged on a support made of dielectric material and is configured to electrically interconnect the second metal layers of the optical resonators belonging to the same pixel;
a readout integrated circuit arranged on a substrate and assembled with said pixel; the readout circuit comprising a buried readout electrode associated with said pixel and a metal or dielectric outer layer.
The assembly comprises at least the first metal layer and the outer layer of the readout integrated circuit being referred to as planar assembly structure.
The second metal layers of the resonators of a pixel are connected to the associated readout electrode by way of a metal via connected to the connection microstructure and passing through the support.
According to one particular aspect of the invention, at least one dimension of a resonator, chosen from among width and length, is within the interval [λ/2n−50%; λ/2n+50%], where:
λ is an incident wavelength;
n is an effective refractive index of the photodetecting structure.
According to one particular aspect of the invention, the height of the photodetecting structure is within the interval [λ/4n−50%; λ/2n+50%], where:
λ is an incident wavelength;
n is an effective refractive index of the photodetecting structure.
According to one particular aspect of the invention, the distance between two adjacent pixels is greater than or equal to the wavelength absorbed by an optical resonator divided by twice the effective refractive index of the photodetecting structure.
According to one particular aspect of the invention, the metal via is electrically isolated from the reflective metal layers of the resonators of said pixel.

According to one particular aspect of the invention, the second metal layer covers the entire surface of the photo-detecting structure.

According to one particular aspect of the invention, the second metal layer covers part of the surface of the photo-detecting structure. The second metal layer is fully covered by an encapsulating layer made of dielectric material.

According to one particular aspect of the invention, the optoelectronic device furthermore comprises an etch stop ring made of a dielectric material arranged on the surface of the photodetecting structure.

According to one particular aspect of the invention, the outer layer of the readout integrated circuit is a metal layer common to all of the resonators of said at least one pixel, and to all of the pixels where applicable. Said metal outer layer is connected to electrical ground.

The reflective metal layer is common to all of the reso-nators of said at least one pixel, and to all of the pixels where applicable. The metal via passes through said assembly structure and part of the readout integrated circuit to the readout electrode.

According to one particular aspect of the invention, the planar assembly structure is structured so as to form indi-vidualized elementary assembly structures for each elec-trode. Said elementary assembly structures are electrically isolated from one another.

An elementary assembly structure associated with an electrode of a pixel is electrically connected to said electrode and to the metal via of said pixel.

Another subject of the invention is a matrix image sensor comprising an optoelectronic device according to the inven-tion.

Another subject of the invention is a process for manu-facturing an optoelectronic device, the process comprising the steps of:

assembling a first planar structure comprising a first substrate, an assembly of at least one photodetecting layer and a first reflective metal layer, on the one hand, and a readout integrated circuit deposited on a second substrate and comprising at least one buried readout electrode and a metal or dielectric outer layer, on the other hand.

The assembly comprising at least the first metal layer and the outer layer of the readout integrated circuit forms a planar assembly structure. The planar assembly struc-ture is either continuous or structured. The structured planar assembly structure comprises individualized elementary assembly structures that are electrically isolated from one another.

When the planar assembly structure is continuous, the buried readout electrode is electrically isolated from the continuous planar assembly structure.

When the planar assembly structure is structured, the buried readout electrode is electrically connected to an elementary assembly structure.

detaching the first substrate;

producing at least one pixel associated with a buried electrode, comprising the sub-steps of:

producing a plurality of optical resonators by:

Selectively etching each of the layers of said assem-bly of at least one photodetecting layer to produce a plurality of photodetecting structures;

Depositing a second metal layer on each photode-tecting structure;

when the planar assembly structure is structured, the photodetecting structure is located facing an indi-vidualized elementary assembly structure.

producing a support made of dielectric material between the resonators and connecting said optical resonators to one another by way of a connection microstructure arranged on said support;

producing a metal via passing through the support so as to connect the second metal layers of the resonators to the associated buried electrode via the connection micro-structure.

According to one particular aspect of the invention, when the planar assembly structure is continuous, the step of producing the metal via comprises the sub-steps of:

etching a via hole passing through the assembly structure to the buried electrode;

filling the via hole with a conductive material in order to electrically connect the second metal layers to the buried electrode.

The step of producing the support is such that said support does not cover the via hole.

According to one particular aspect of the invention, when the planar assembly structure is structured, the step of producing the metal via comprises the sub-steps of:

etching a via hole passing through the support to the elementary assembly structure connected to the buried electrode;

filling the via hole with a conductive material in order to electrically connect the second metal layers to the elementary assembly structure connected to the buried electrode.

According to one particular aspect of the invention, the process for manufacturing an optoelectronic device further-more comprises a pixel encapsulation step, comprising the following sub-steps:

depositing an encapsulating layer made of dielectric mate-rial covering the second metal layers and the connec-tion microstructure.

selectively etching the encapsulating layer so as to retain at least the parts covering the first metal layer and the connection microstructure.

According to one particular aspect of the invention, the process for manufacturing an optoelectronic device accord-ing to the invention comprises:

a step of depositing an etch stop layer on an outer layer of said assembly of at least one photodetecting layer prior to the step of producing at least one pixel associated with a buried electrode.

The step of producing at least one pixel furthermore com-prises the following sub-steps:

selectively etching the etch stop layer so as to produce, for each resonator, an etch stop ring arranged on part of the surface of the photodetecting structure serving to con-tain the first metal layer.

According to one particular aspect of the invention, the conductive material deposited to produce the second metal layer (M2) and the metal via (V1) is gold or titanium or platinum.

According to one particular aspect of the invention, the conductive material deposited to produce the second metal layer and the metal via is copper or aluminum or tungsten.

According to one particular aspect of the invention, the step of producing a plurality of optical resonators and the step of producing the metal via are carried out by lithogra-phy then etching, the lithography technology being chosen from among: electron beam; nanoprinting; optical lithogra-phy, and the etching technology being chosen from among ion etching, chemical etching or plasma.

BRIEF DESCRIPTION OF THE DRAWINGS

Other features and advantages of the present invention will become more apparent on reading the following description in relation to the following appended drawings.

FIG. 4d illustrates a manufacturing process for hybridizing a pixel belonging to a hybrid optoelectronic system according to the first embodiment illustrated in FIG. 4a.

DETAILED DESCRIPTION

Figure 3:
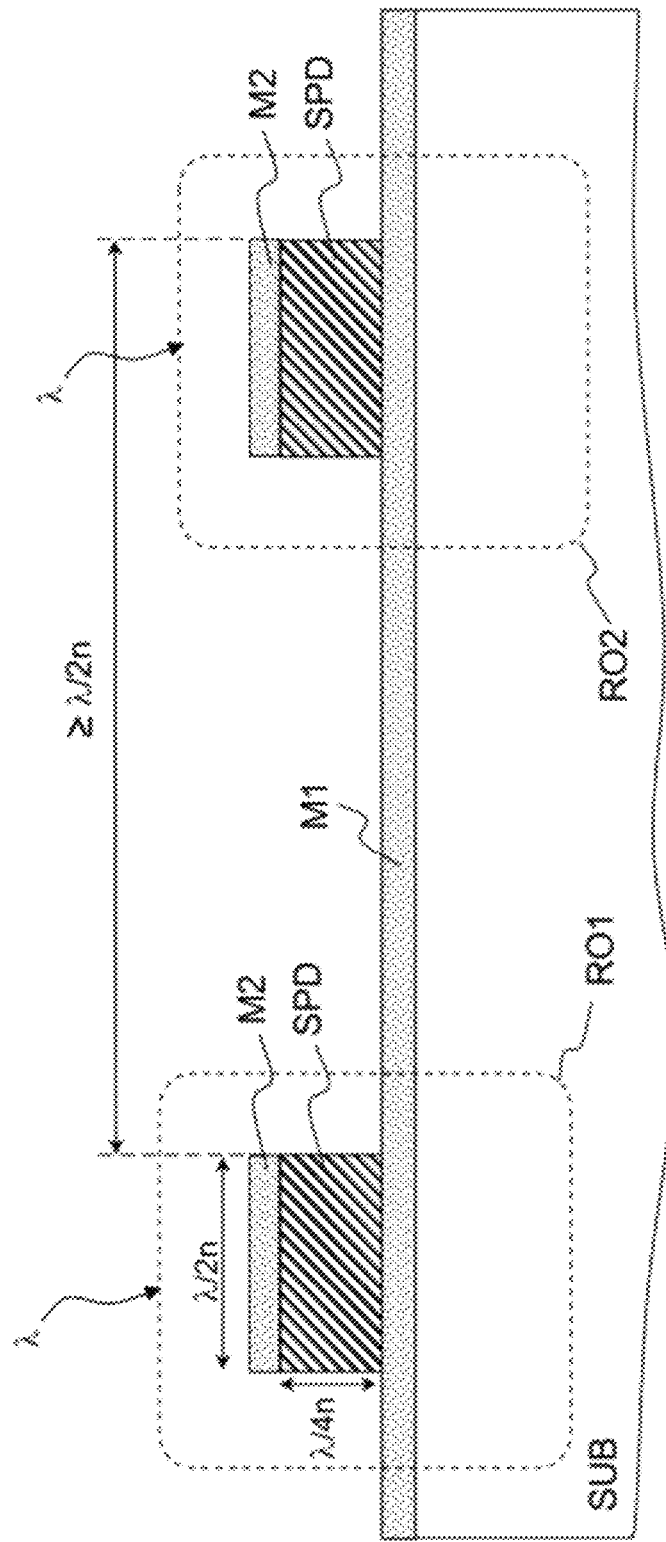
FIG. 3 illustrates a diagram of two optical resonators integrated into a matrix image detector in the infrared frequency region.

We will start by introducing the basic structure of a pair of optical resonators $RO_1$ and $RO_2$ that are not integrated into a hybrid system. FIG. 3 illustrates a diagram of two optical resonators of a matrix image detector in the infrared frequency region.

The optical resonators $RO_1$ and $RO_2$ shown in FIG. 3 rest on a substrate SUB made of semiconductor material. We will limit ourselves at this stage to showing the substrate SUB to simplify the depiction.

Each optical resonator $RO_1$ or $RO_2$ comprises a photodetecting structure SPD made of a first semiconductor material SC1 and defining a mesa, a first reflective metal layer M1 and a second metal layer M2. The photodetecting mesa structure SPD is confined between the first reflective metal layer M1 and the second metal layer M2. A "mesa" is understood to mean a microstructure or nanostructure corresponding to a volume resting on a plane and having a flat upper surface.

The photodetecting structure PD is located in the photonic cavity formed by the optical resonator $RO_1$ (or $RO_2$). This structure is produced using a III-V material such as, by way of example, gallium arsenide, indium arsenide, gallium nitride, gallium antimonide, boron phosphide, as well as their ternary, quaternary or quinary alloys.

As an alternative, it is possible to produce photodetecting homojunctions that are obtained via doping variations or gradients in a structure made of semiconductor material.

As an alternative, it is possible to produce the photodetecting structure of an optical resonator $RO_1$ (or $RO_2$) with a stack of a plurality of layers. The stack is formed of different semiconductor materials, thus forming a photodetecting heterostructure. The semiconductor materials used to produce the stack of layers of the photodetecting heterostructure are III-V semiconductor materials such as, by way of example, gallium arsenide, indium arsenide, gallium nitride, gallium antimonide, boron phosphide, as well as their ternary or quaternary or quinary alloys. Doping these layers (N or P) makes it possible to define photodiode or photoconductor architectures.

According to one particular aspect of the invention, the photodetecting structure corresponds to a set of colloidal quantum dots (CQD).

The photodetecting structure SPD rests on the reflective metal layer M1 acting as mirror.

Generally speaking, the reflective layer M1 is common to all of the optical resonators RO of the hybrid device OPT, electrically connected to the electrical ground of the device.

In another embodiment, it is conceivable to have a reflective layer M1 dedicated to each pixel and therefore for the interconnected optical resonators RO belonging to said pixel.

In another embodiment, it is conceivable to have a reflective layer M1 dedicated to each optical resonator RO of the matrix image detector.

Figure 1:
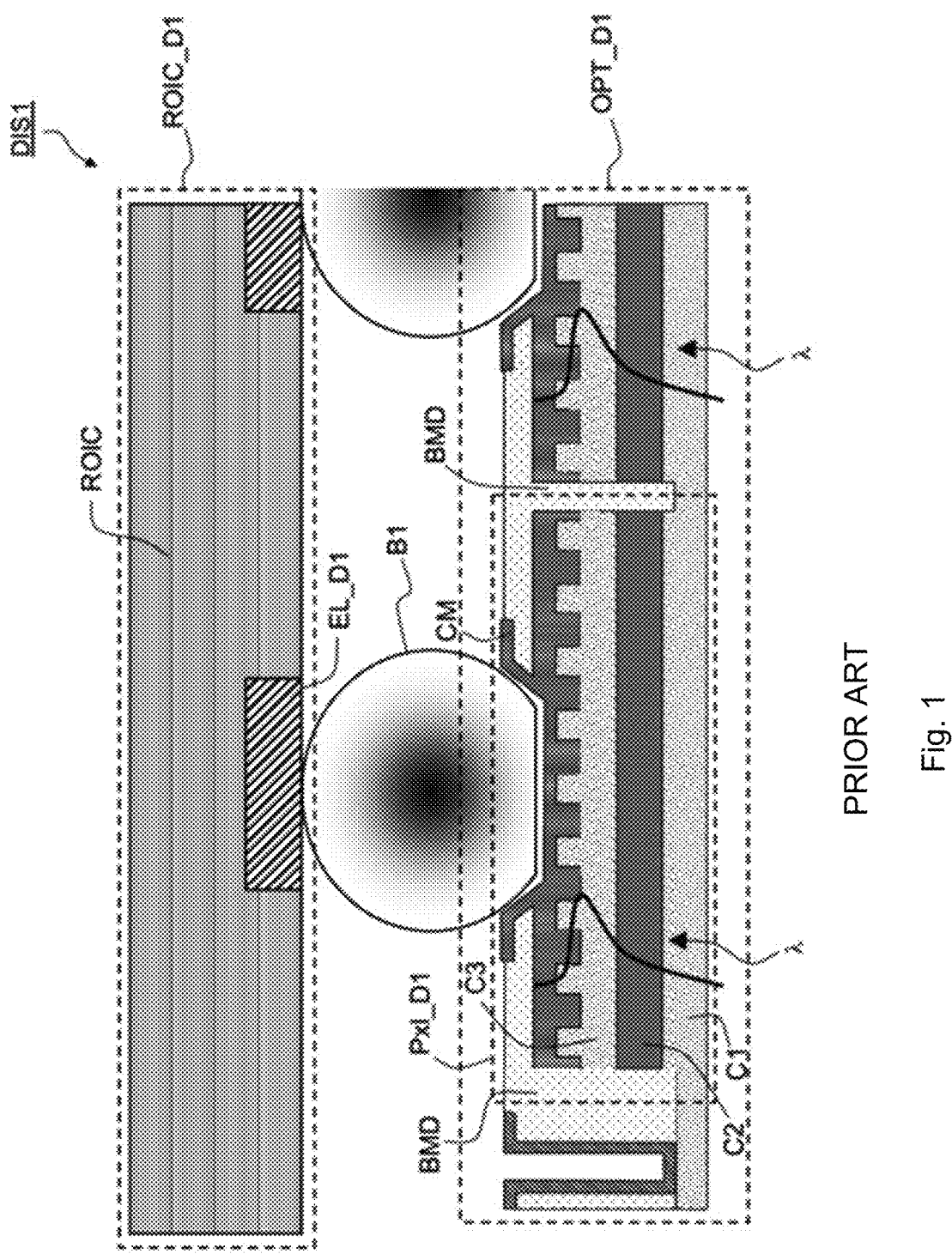
FIG. 1 illustrates a partial sectional view of a hybrid optoelectronic system according to the prior art, having an optical part comprising a diffraction grating.
Figure 2A:
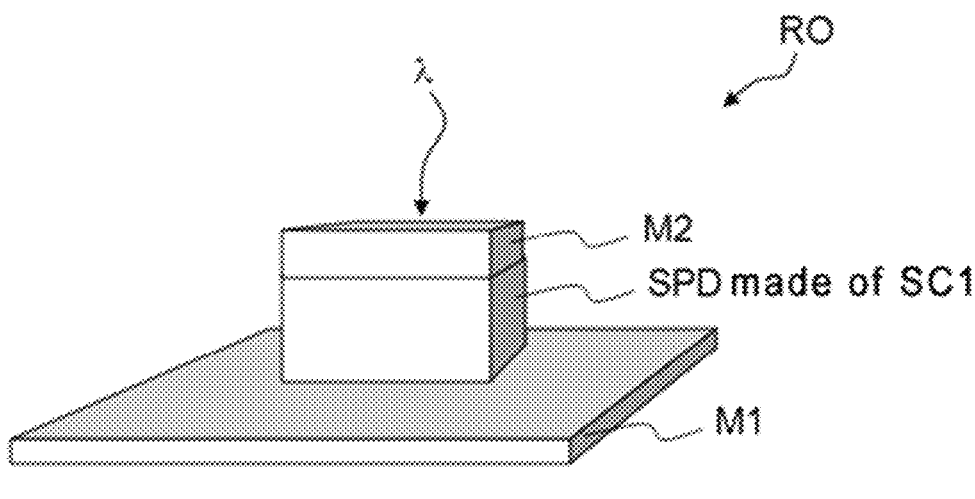
FIG. 2a illustrates a perspective view of one example of a cube-shaped optical resonator.
Figure 2B:
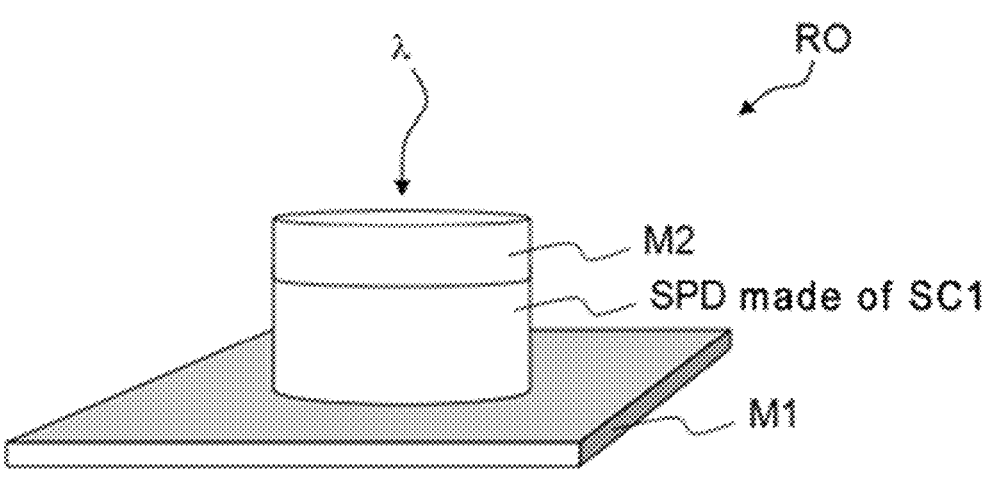
FIG. 2b illustrates a perspective view of one example of a cylinder-shaped optical resonator.

The association of the reflective metal layer M1 with the second upper metal layer M2 and with the photodetecting structure defines a sub-wavelength nano-antenna for an optical resonator, as described in FIG. 1. The upper metal layer M2 is deposited on the exposed surface of the photodetecting mesa SPD. The nanometer-scale dimensioning of the resonator RO allows it to absorb particular modes of a wave incident on the side of the upper layer M2 and having a wavelength $\lambda$ in the infrared region.

By way of indication, the reflective layer M1 and the upper layer M2 may be produced with gold (Au) having a layer thickness that varies between 25 nm and 500 nm for the reflective layer M1 and a layer thickness that varies between 150 nm and 1000 nm for an upper layer M2. In addition and by way of example, it is possible to produce the metal layers M1 and M2 with copper, aluminum, palladium, platinum, silver and tungsten.

Advantageously, if n denotes the refractive index of the material of the photodetecting mesa SPD, the resonator $RO_1$ (or $RO_2$) is dimensioned as follows: at least one dimension of a resonator (and therefore of the upper layer M2), chosen from among width or length, is within the interval [$\lambda/2n$–

50%; $\lambda/2n+50\%$] and the height of the photodetecting layer PD is within the interval [$\lambda/4n-50\%$; $\lambda/2n+50\%$]. Moreover, the distance separating two adjacent optical resonators is greater than $\Delta/2n$.

The thicknesses of the metal layers M1 and M2 of the resonator are above the skin thickness and below the diffraction limit.

These dimensioning intervals make it possible to implement the resonator operation with the microstructures $RO_1$ and $RO_2$ described above. Indeed, each of the resonators enhances the light-matter coupling between the vertical cavity mode TMO and the photosensitive structure SPD, making it possible to enhance the response of low-quantum-efficiency technologies, such as quantum well intersubband detectors (QWIPs and QCDs) or II-VI colloidal quantum dots (CQD).

For a resonator, when the structure is resonant, light is then guided and focused in the photodetecting cavity SPD under the upper layer M2, making it possible to guarantee an optimum modulation transfer function (MTF), by reducing (or even completely eliminating) optical and electrical cross-talk phenomena between the resonators. In the knowledge that, in the hybrid device OPT, each pixel corresponds to one or more interconnected resonators, the structure described by FIG. 3 then makes it possible to reduce the pixel pitch to its final dimension, corresponding to a sub-wavelength pitch. Moreover, the effective semiconductor volume is far smaller than in planar optoelectronic devices. Dark current and noise are thus reduced in the device OPT comprising resonators $RO_1$. We will add that this architecture is intrinsically fast because it has a low pixel capacity.

Figure 4A:
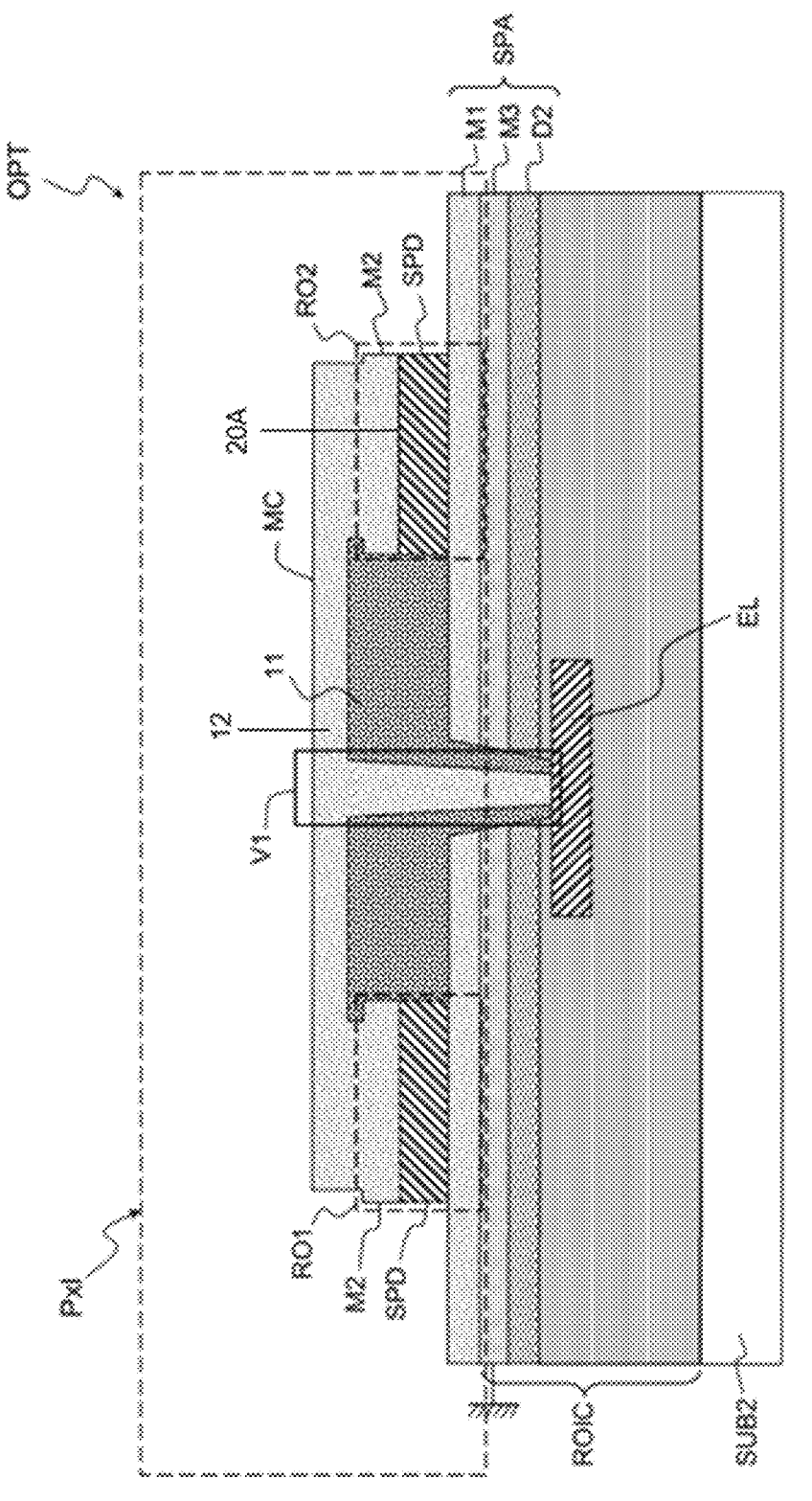
FIG. 4a illustrates a first embodiment according to the invention of the hybridization of a pair of optical resonators of one and the same pixel belonging to a hybrid optoelectronic system.

FIG. 4a illustrates a first embodiment of a plurality of optical resonators $RO_1$, $RO_2$ that are interconnected so as to form a pixel Pxl according to the invention. The pixel Pxl is hybridized with a readout integrated circuit ROIC by electrically interconnecting the upper metal layers M2 of the resonators $RO_1$, $RO_2$ belonging to one and the same pixel Pxl by way of a connection microstructure MC, and by electrically connecting said upper layers to the buried readout electrode EL belonging to the readout integrated circuit ROIC and intended to read the signals photogenerated by the pixel Pxl.

A hybrid optoelectronic device comprises at least one pixel Pxl belonging to a detection matrix. In the solution described by the invention, each pixel comprises a plurality of optical resonators RO whose photodetecting structure SPD is made of a first semiconductor material SC1 that is generally a III-V semiconductor material. The device furthermore comprises a readout integrated circuit ROIC that is made of a second semiconductor material SC2 that is generally silicon and is arranged on a silicon substrate Sub2. The readout circuit ROIC is generally formed by a plurality of transistors and thin layers of conductive, semiconductor or dielectric CMOS-technology material (not shown here to simplify the illustration) on the silicon substrate Sub2.

The wafer comprising the layers forming the optical part and the wafer comprising the readout circuit ROIC are assembled. The operation of assembling the two structures forms a planar assembly structure SPA comprising a stack of layers belonging to the optical part of the system or to the readout integrated circuit ROIC. In the example illustrated by FIG. 4a, the planar assembly structure is formed on one side of the reflective metal layer M1 belonging to the optical part and on the other side of the layer stack formed of the metal layer M3 connected to the electrical ground of the circuit ROIC and the dielectric passivation layer D2 of the circuit ROIC. More details on the assembly process will be given later.

As an alternative, it is possible to produce not a metal-metal assembly, as illustrated in FIG. 4a, but a dielectric-dielectric assembly. The planar assembly structure SPA in this case is formed of the outer dielectric passivation layer of the optical part and the outer dielectric passivation layer of the readout integrated circuit ROIC, as well as the reflective layer M1.

In the first embodiment illustrated by FIG. 4a, the layers M1, M3 and D2 (D2 being a dielectric layer) of the planar assembly structure SPA together form a single stack having electrical and spatial continuity across the surface occupied by a pixel or across the surface of the entire system wafer. In this embodiment, the reflective layer M1 is common to all of the resonators belonging to one and the same pixel. It is also conceivable to produce a single reflective layer M1 common to all of the pixels Pxl of the matrix.

As described above, the optical resonator RO comprises a photodetecting structure SPD made of III-V semiconductor material and defining a mesa for example, an upper metal layer M2 and a reflective metal layer M1. The photodetecting structure SPD is confined between the reflective metal layer M1 and the upper metal layer M2.

In a device according to the invention, the resonators $RO_1$ and $RO_2$ belonging to one and the same pixel are connected by way of a connection microstructure MC resting on a support 11 made of dielectric material and comprising one or more metal tracks 12 deposited on said support 11. The metal tracks 12 connect the upper metal layers M2 of the optical resonators of one and the same pixel.

In addition, a pixel Pxl belonging to the image detector OPT is hybridized according to the invention by way of a metal connection via V1 that electrically connects the upper metal layers M2 of the optical resonators $RO_1$ and $RO_2$ (optical part) belonging to the pixel Pxl to the readout electrode EL associated with the same pixel and buried in the wafer of the circuit ROIC (electrical part).

The connection via V1 is a through-via from any point of the connection microstructure MC to the buried electrode EL, passing through the dielectric support 11 and the planar assembly structure SPA. This solution makes it possible to achieve pixelation because it makes it possible to individually read the signal generated by each pixel comprising a plurality of resonators $RO_1$. This solution is compatible with a "wafer to wafer" assembly, as shown in FIG. 4a by way of indication. This solution makes it possible to interconnect a hybrid system, making it possible to create an interconnection architecture between each of the pixels Pxl and the readout electrode associated with each pixel.

This solution is also compatible with a "die to wafer" assembly. A die is understood here to mean an integrated circuit manufactured beforehand on a semiconductor wafer and cut out beforehand from the wafer without mounting of a package. This solution is also compatible with a "multi-wafer to wafer" assembly.

The via V1 has to pass through the planar assembly structure comprising the reflective metal layer connected to electrical ground and common to all of the pixels of the matrix.

Moreover, for each pixel Pxl, the via V1 passing through the support 11 and the planar assembly structure SPA has to connect the upper metal layers M2 to the buried readout electrode EL.

To avoid a short circuit with the layers that are passed through (M1, M3, D2 for example), the via V1 is passivated by keeping a side wall from the support 11 made of dielectric material inside the via V1 so as to electrically isolate it from the reflective metal layer M1 and from the planar assembly structure SPA.

Figure 4B:
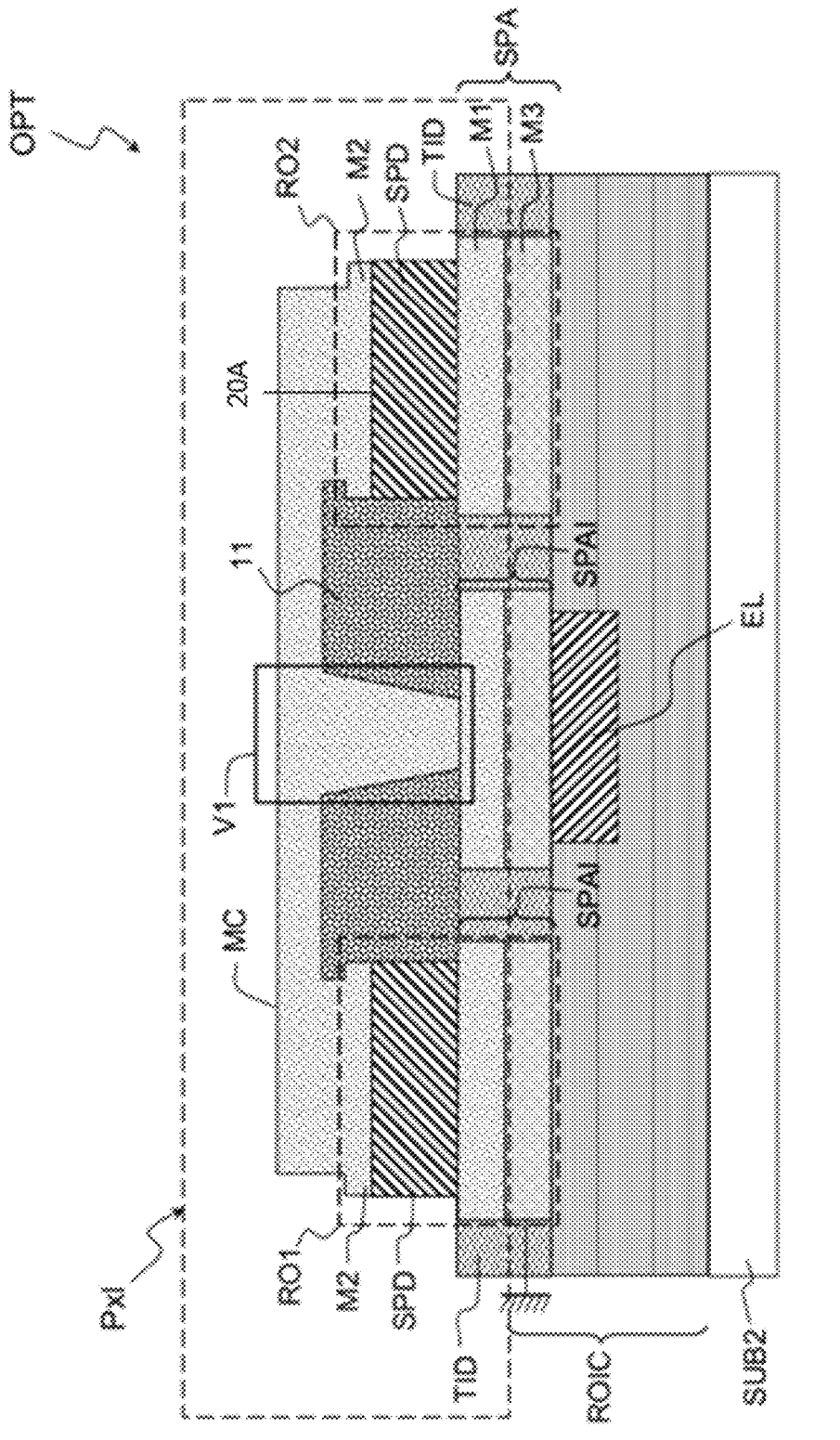
FIG. 4b illustrates a second embodiment of the hybridization of a pair of optical resonators of one and the same pixel belonging to a hybrid optoelectronic system.

FIG. 4b illustrates a second embodiment of the pixel according to the invention comprising a structured planar assembly structure.

The second embodiment differs from the first embodiment by the following points:

the planar assembly structure SPA is not continuous over the entire surface of the wafer, but structured such that, for each electrode EL, an individualized elementary assembly structure SPAI is produced and, for each optical resonator $RO_1$, an individualized elementary assembly structure SPAI is produced.

The elementary assembly structures SPAI are electrically isolated from one another by way of a plurality of isolation trenches TID made of dielectric material.

Each readout electrode (EL) is electrically connected to the associated elementary assembly structure SPAI.

The metal via V1 passes through only the support 11, and it is electrically connected to the elementary assembly structure SPAI associated with the readout electrode EL, and the via is thus electrically connected to the electrode EL.

The structure of an infrared matrix detector pixel according to the invention described in FIG. 4a or FIG. 4b may be produced via a manufacturing process based on the technological steps of a production line for the manufacture of circuits or microsystems based on III-V semiconductors.

A "III-V process" is understood to mean the processes found in clean room environments commonly processing wafers in the format of 100 mm or smaller. Wafers are often processed individually, or in batches of a few units at most. Most of the handling of the wafers is manual. Lithography operations are carried out by contact-based or projection-based processes, with resolutions of the order of μm down to 500 nm. The metal layers and structures are structured by "lift-off" depositions or ion etching. The metals that are generally used are noble metals such as platinum (Pt), gold (Au) and silver (Ag). CMP bonding and planarization technological steps are uncommon with this type of process.

The invention proposes a process of the "III-V process" type for manufacturing and interconnecting a plurality of optical resonators ROi forming a pixel Pxl, but also for carrying out the assembly, the pixelation and the interconnection of the pixel Pxl. We will limit ourselves in FIG. 4c to showing the technological steps of the process P1 for a pixel Pxl1 comprising two resonators $RO_1$ and $RO_2$ to simplify the understanding of the process. However, the steps of the process may be generalized for a plurality of pixels belonging to the same hybrid system, and they may be carried out simultaneously for the entire pixel matrix.

Figure 4C:
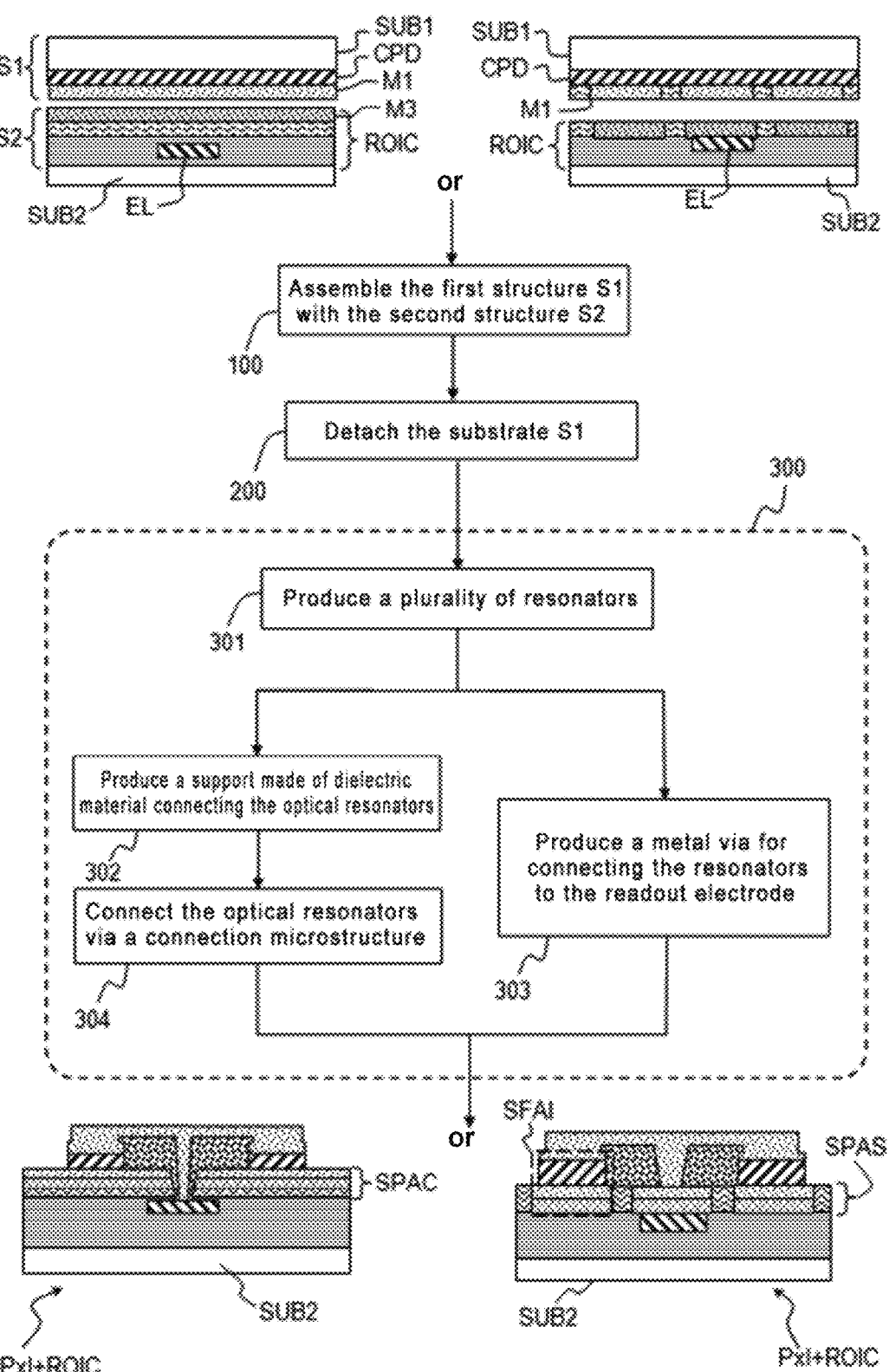
FIG. 4c illustrates a generic manufacturing process for hybridizing a pixel belonging to a hybrid optoelectronic system.
Figure 4D:
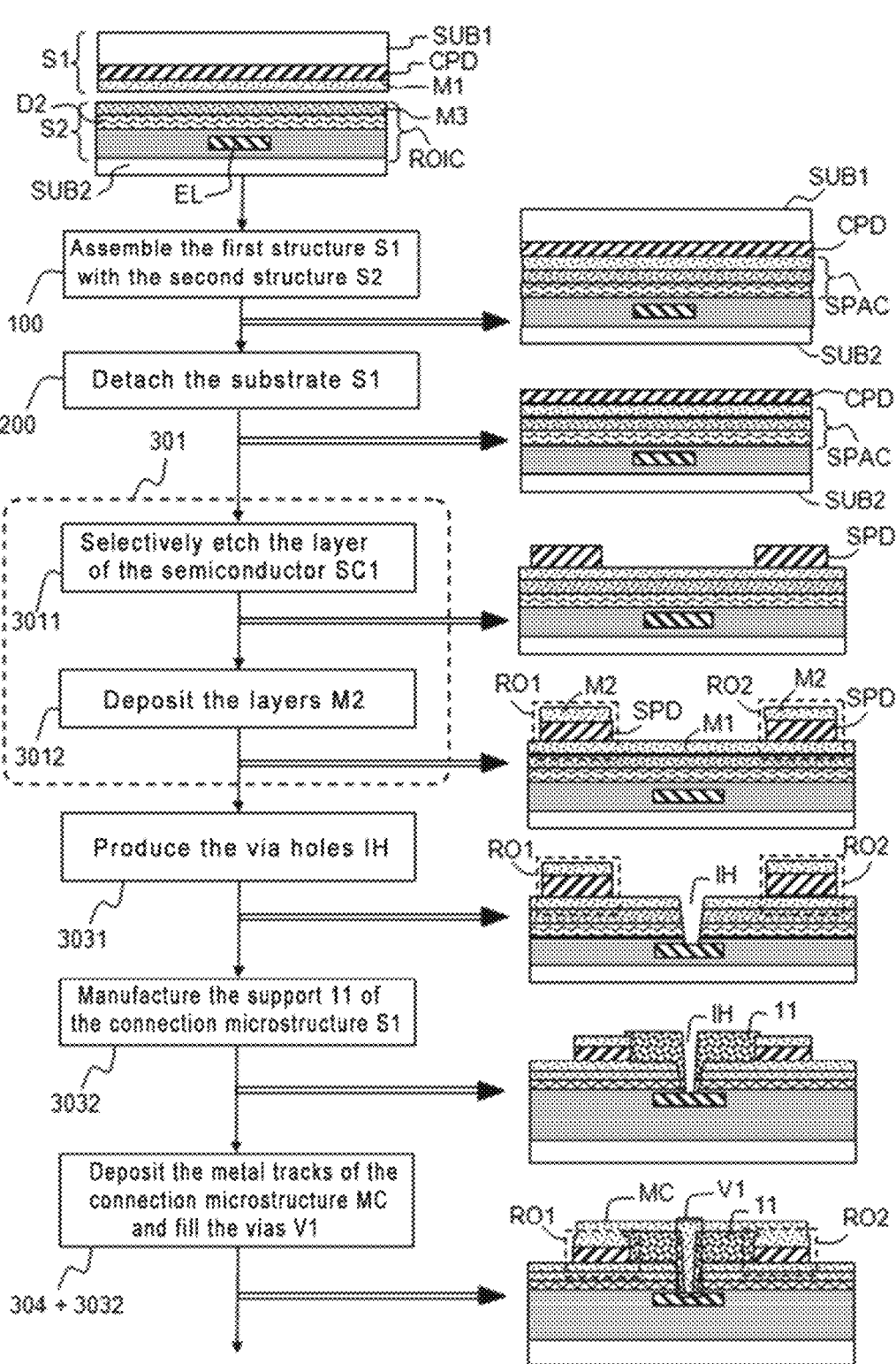

We will first present the technological steps of manufacturing a pixel according to the invention in a general manner in FIG. 4c.

The first step 100 consists in assembling a first planar structure S1 comprising a first substrate Sub1, a photodetecting layer CPD made of a III-V semiconductor material and a first reflective metal layer M1, on the one hand; and a readout integrated circuit ROIC, manufactured beforehand, deposited on a second substrate Sub2 and comprising at least one buried readout electrode EL and a third metal layer M3 that is generally connected to electrical ground, on the other hand. The assembly comprising at least the first metal layer M1 and the third metal layer M3 forms a planar assembly structure SPA following the assembly operation.

The first structure S1 has the sample used to manufacture the optical part of the hybrid system.

As explained above, it is conceivable to use, for the optical part, a first planar structure S1 comprising a stack of a plurality of layers of various semiconductor materials together forming a heterostructure of photodetecting layers (corresponding to CPD). The stacked layers will be used to manufacture the photodetecting structures SPD of the resonators. We will limit ourselves to showing a single photodetecting layer CPD in the following illustrations for the sake of simplification but without loss of generality.

The planar assembly structure SPA may be continuous over the entire surface of the wafer since the reflective metal layer M1 and the electrical ground metal layer M3 are continuous and common to all of the pixels of the device to be manufactured. In the case of a continuous planar assembly structure SPAC, the readout electrodes EL are electrically isolated from the layers forming the continuous planar assembly structure SPAC.

As an alternative, the planar assembly structure SPA may be structured SPAS and comprise individualized elementary assembly structures SPAI for each optical resonator to be manufactured and for each readout electrode EL. The elementary assembly structures SPAI are electrically isolated from one another by way of a plurality of isolation trenches TID made of dielectric material. An elementary assembly structure SPAI associated with an electrode is electrically connected to said readout electrode EL.

The assembly is carried out by bonding, a technique that is developing rapidly and that constitutes important progress for carrying out what are known as "above IC" technological steps, that is to say steps that are able to be carried out directly on the wafer of the readout circuit ROIC, typically of CMOS type, and collectively on all of the dies. This compatibility with CMOS manufacturing means is conducive for a significant reduction in production costs and the possibility of achieving finer-sized technological patterns.

The second step 200 consists in detaching the substrate Sub1 so as to keep only the substrate Sub2 on which the readout circuit ROIC is produced.

The third step 300 consists in producing a pixel according to the invention for each buried readout electrode EL. This step comprises multiple sub-steps that may be carried out sequentially or in parallel:

the first sub-step 301 consists in producing a plurality of optical resonators $RO_i$ of rank i–0 to N, where N is a strictly positive integer corresponding to the number of optical resonators belonging to said pixel Pxl.

the second sub-step 302 consists in producing a support 11 made of dielectric material between the resonators serving to ensure a planarization phase for accommodating a connection microstructure MC formed of metal tracks 12 resting on said support 11.

the third sub-step 303 consists in producing the metal connection via V1, making it possible to directly or indirectly electrically connect the connection microstructure MC (and therefore the upper layers M2 of the optical resonators) to the buried readout electrode EL.

the fourth sub-step 304 consists in depositing a conductive material so as to produce the connection microstructure MC interconnecting the upper metal layers M2 of the optical resonators $RO_i$ of said pixel Pxl.

Carrying out sub-steps 302, 303 and 304 comprises material deposition, etching and lithography operations that may be carried out in parallel according to the structure of the manufactured pixel.

FIG. 4c illustrates, in more detail, the manufacturing process according to the invention for a pixel comprising two resonators $RO_1$ and $RO_2$ according to the first embodiment described in FIG. 4a.

The first assembly step 100 is carried out as described above to form a continuous planar assembly structure SPAC. The result of the assembly step 100 is illustrated in the sectional view 100a, which shows the structure S1 assembled with the readout circuit ROIC such that the planar assembly structure SPA is continuous. The continuous planar assembly structure SPAC consists of the reflective metal layer M1 belonging to the first structure S1 and of the stack formed of a metal layer M3 connected to the electrical ground of the readout circuit ROIC and of a passivation layer of the circuit ROIC, denoted D2, made of dielectric material. The assembly step 100 then ensures the electrical connection of the reflective metal layer M1 to the overall electrical ground of the hybrid system. The readout electrode EL is electrically isolated from the continuous planar assembly structure SPAC. The reflective metal layer M1 is common to all of the optical resonators of the pixel Pxl. The metal ground layer M3 is common to all of the pixels of the optoelectronic system. The second step 200 consists in detaching the first substrate Sub1, as described above.

Next, the sub-step 301 of producing the resonators ROi is carried out by:

selectively etching (sub-step 3011) the photodetecting layer CPD to produce a photodetecting structure SPD for each resonator. The illustration 3011a of the result of this sub-step shows the photodetecting structure SPD in the form of a mesa resting on the common reflective metal layer M1.

then by depositing (sub-step 3012) a conductive material on the upper surface of each of the photodetecting structures SPD to produce the upper metal layers M2 of each optical resonator $RO_1$ (and $RO_2$). This operation may be carried out for example via a "lift-off" deposition process. This is an additive technique used in microtechnology aimed at creating patterns of a target material (in this case the upper layers M2) on the surface of a substrate (in this case the stack of layers M1 and SPD) using a sacrificial material (generally a photoresist). The structure obtained after carrying out sub-step 3012 is illustrated in the sectional view 3012a. This shows the photodetecting structure SPD confined between the reflective metal layer M1, connected to electrical ground, and the upper metal layer M2 for each of the resonators $RO_1$ and $RO_2$.

The following step 3031 is a sub-step of producing 303 the metal via V1. It consists in producing a via hole IH passing through the continuous planar assembly structure SPAC to the buried electrode EL. The via hole is produced at the readout electrode EL in a "non-active" region not containing any resonator $RO_i$ of the pixel Pxl. Sub-step 3031 is for example carried out by way of a plasma or ion etching operation. The via hole IH that is obtained after carrying out sub-step 3031 is illustrated in the sectional view 3031a.

The following step 302 consists in manufacturing the support 11 made of dielectric material connecting the second metal layers M2 of the resonators $RO_1$, $RO_2$ of the same pixel Pxl. The support 11 does not cover the via hole IH while at the same time forming a wall internal to the via hole IH made of dielectric material so as to ensure passivation of the hole IH and thus the via V1. Passivation is necessary to electrically isolate the via V1 from the layers that are passed through, belonging to the planar assembly structure SPA. The support 11 provided for the connection microstructure MC may be manufactured by way of a planarization process compatible with a III-V process.

More specifically, using an HSQ resin for example, electron beam lithography allows localized insolation of the HSQ layer. Under the action of exposure to the electron beam, the HSQ resin crosslinks so as to have an appearance similar to a dielectric in the solid state, and more particularly silicon dioxide SiO2. It is then possible to trace, with nanometric precision, solid patterns from the HSQ layer. The combination of an HSQ resin with electron beam lithography furthermore has a significant advantage. By controlling the exposure dose of the HSQ to electrons, it is possible to vary its thickness after exposure. This makes it possible to locally adjust the height of the support 11 so as to adapt to the various reliefs of the sample. Following the phase of insolation of the resin and the solidification of the patterns that form the support 11, the non-solidified parts of the deposited resin are removed from the surface of the wafer so as to keep only the crosslinked solid parts of the resin.

The sectional view 304a illustrates the intermediate result obtained following the sub-step 304 of manufacturing the support 11.

The last sub-step consists in depositing a conductive material on the support 11 so as to simultaneously:

connect (304) the optical resonators $RO_1$ and $RO_2$ via a connection microstructure MC consisting of at least one metal track in order to electrically interconnect the second metal layers M2 of the resonators $RO_1$ and $RO_2$ of one and the same pixel Pxl;

and fill (3032) the via hole (IH) in order to electrically connect the connection microstructure MC to the buried electrode (EL) and thus said second metal layers M2.

The process P1 according to one embodiment of the invention thus makes it possible to produce at least one pixel Pxl of an optoelectronic system comprising a plurality of optical resonators while at the same time carrying out the operation of hybridizing the optical part with the electrical part of the system.

Figure 4E:
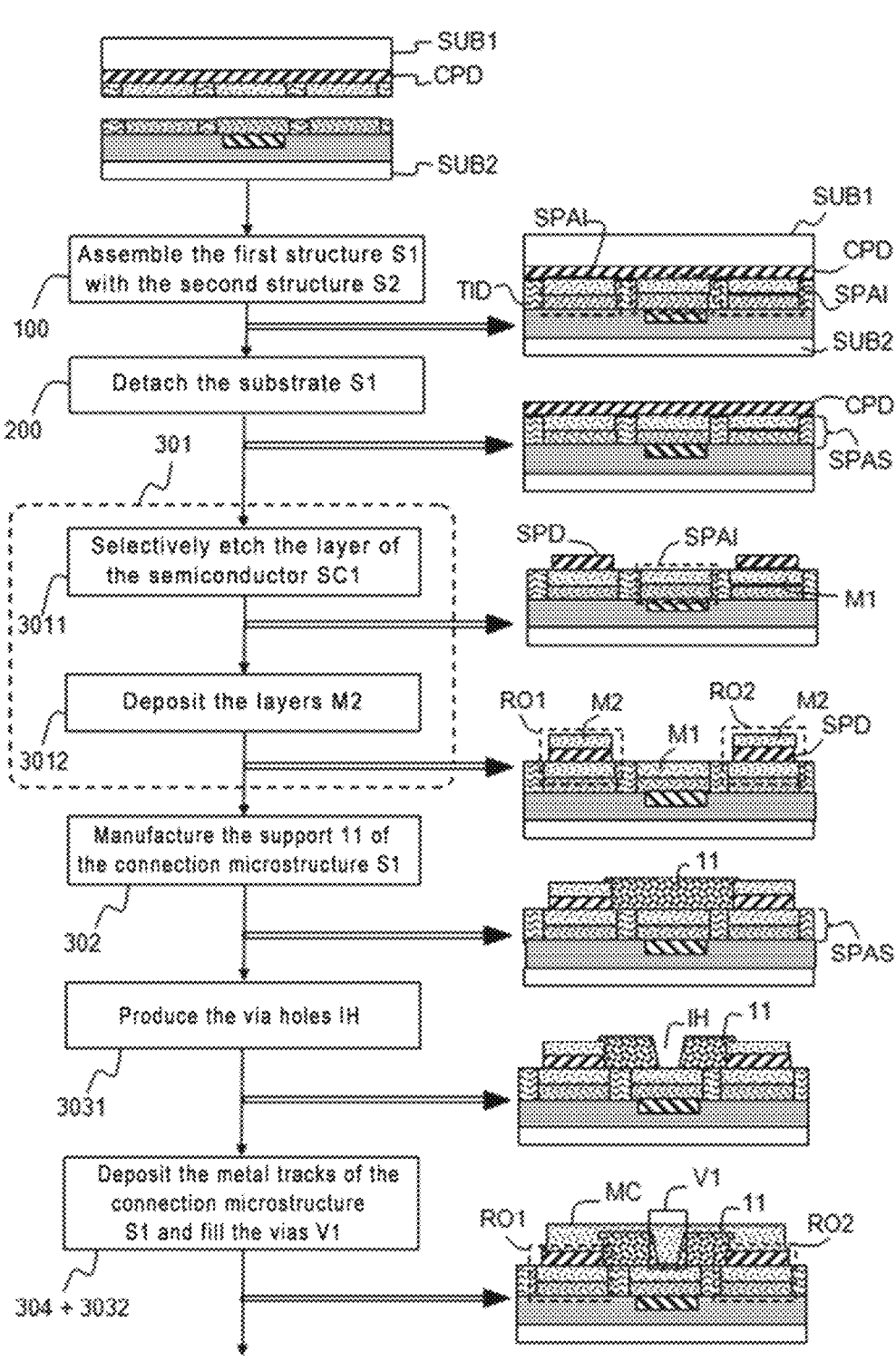
FIG. 4e illustrates a manufacturing process for hybridizing a pixel belonging to a hybrid optoelectronic system according to the second embodiment illustrated in FIG. 4b.

FIG. 4e illustrates, in more detail, the manufacturing process according to the invention for a pixel comprising two resonators $RO_1$ and $RO_2$ according to the second embodiment described in FIG. 4b.

The first assembly step 100 is carried out so as to form a structured planar assembly structure SPAS as described above. The result of the assembly step 100 is illustrated in the sectional view 100b, which shows the structure S1 assembled with the readout circuit ROIC such that the planar assembly structure SPA is structured by comprising individualized elementary assembly structures SPAI for each resonator to be manufactured and for each readout electrode EL. Said elementary assembly structures SPAI are electrically isolated from one another. The readout electrode EL is electrically connected to the elementary planar assembly structure SPAI associated with said electrode.

The second step 200 consists in detaching the first substrate Sub1, as described above.

Next, the sub-step of producing the optical resonators is carried out as described above in FIG. 4c, with an additional constraint: Specifically, the selective etching (3011) of the photodetecting layer (3011) is carried out in a targeted manner so as to obtain photodetecting structures SPD each located facing an individualized elementary assembly structure (SPAI).

The following step of manufacturing the support 11 from dielectric material 302 is carried out as described for the process illustrated in FIG. 4c.

The following step 3031 is that of producing a via hole IH passing through the support 11 manufactured beforehand until reaching the individualized elementary planar assembly structure SPAI connected to the buried electrode EL.

The last sub-step consists in depositing a conductive material on the support 11 so as to simultaneously:

connect (304) the optical resonators RO$_1$ and RO$_2$ via a connection microstructure MC consisting of at least one metal track in order to electrically interconnect the second metal layers M2 of the resonators RO$_1$ and RO$_2$ of one and the same pixel Pxl;

and fill (3032) the via hole (IH) in order to electrically connect the connection microstructure MC to the individualized elementary planar assembly structure SPAI associated with the electrode EL and thus connect said second metal layers M2 to the readout electrode EL of the associated pixel Pxl.

In the following section, we will describe other embodiments of the structure of the pixel Pxl according to the invention, compatible with a "CMOS process" of a silicon foundry production line. A "CMOS process" is understood to mean the processes found in clean room environments processing large-format wafers (200 mm, 300 mm, 450 mm). Wafers are handled by automatons, and are often processed in batches of 10 to 25 units that connect directly onto the equipment. Lithography operations are step-by-step lithographies carried out by projection with largely sub-micron resolutions. The metals are structured using damascene processes comprising steps of depositing an insulating layer followed by etching the insulating layer, and then depositing metal in the cavity created, and finally CMP planarization to remove excess metal. The metal structures may also be produced by ion milling. Noble metals are less common because they contaminate CMOS structures, with the exception of copper, which is ubiquitous due to its use in the production of interconnection levels between transistors. Contamination by metal structures is managed via decontamination steps, and/or by encapsulation.

The use of a CMOS process to manufacture hybrid systems allows access to silicon production lines, and therefore to low-cost and high-volume manufacturing.

Figure 4F:
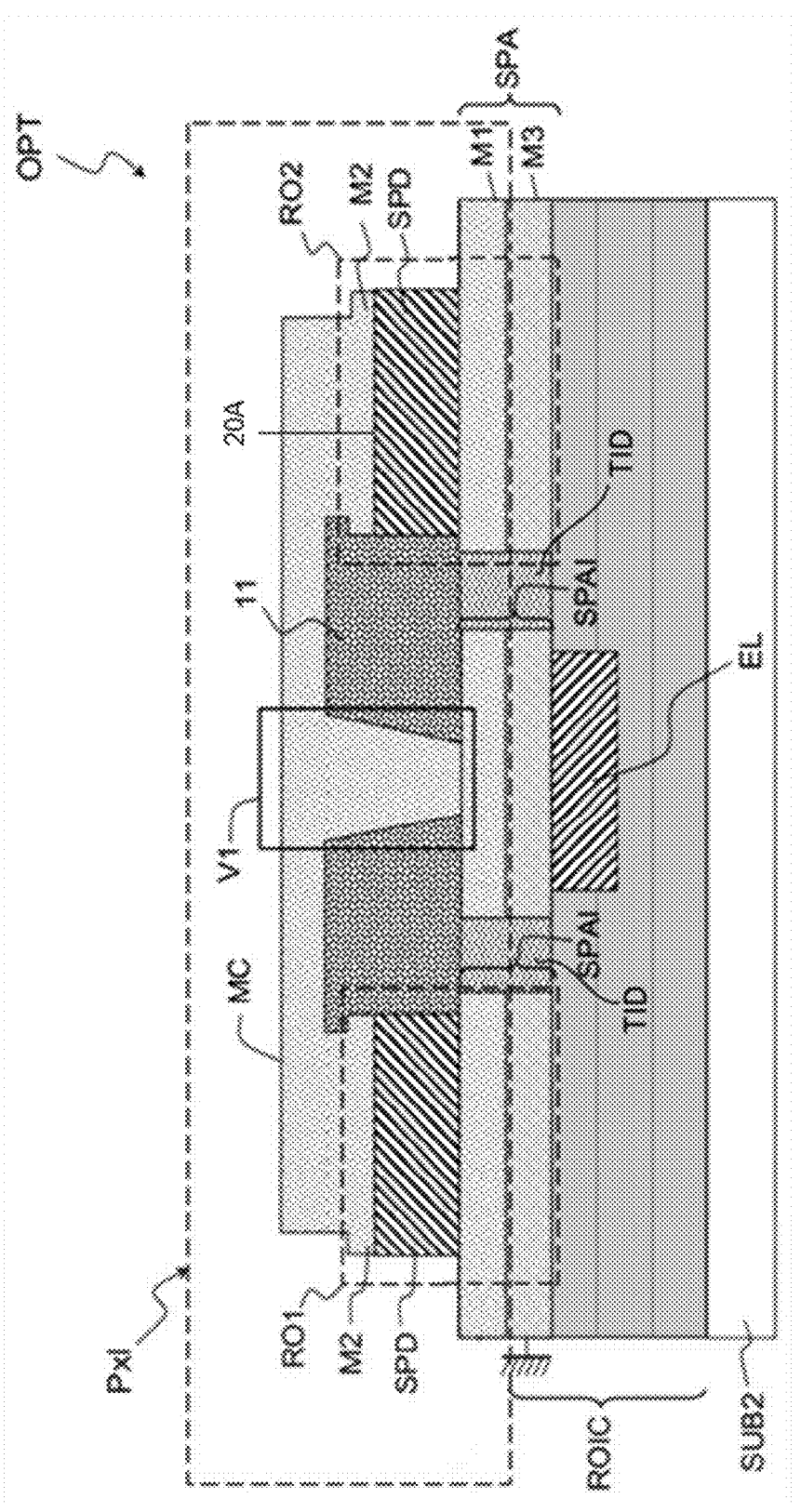
FIG. 4f illustrates a third embodiment of the hybridization of a pair of optical resonators of one and the same pixel belonging to a hybrid optoelectronic system.

FIG. 4f illustrates a third embodiment of the hybridization of a pair of optical resonators of one and the same pixel belonging to a hybrid optoelectronic system.

The third embodiment comprises another alternative embodiment of the structured planar assembly structure SPAS. Indeed, the structured planar assembly structure SPAS comprises, for each readout electrode EL, an individualized planar assembly structure SPAI that is electrically isolated from the rest of the planar assembly structure by a contour formed by a dielectric isolation trench TID. The difference from the second embodiment is the non-existence of an individualized planar assembly structure SPAI for the optical resonators RO$_i$ and the continuity of the planar assembly structure between the various optical resonators RO$_i$.

The third embodiment thus illustrates a planar assembly structure SPA comprising only one individualized elementary assembly structure SPAI per readout electrode EL. In this case, for the optical resonators RO$_i$, the planar assembly structure SPA comprising the reflective metal layer M1 is common to all of the optical resonators.

This embodiment has additional advantages in relation to the second embodiment. It ensures electrical continuity of the electrical ground, on the one hand, and, on the other hand, the individualized assembly structure of the readout electrode EL allows the interconnection between the optical resonators and the associated readout electrodes without the risk of a short circuit with the ground plane.

The process for manufacturing an optoelectronic device according to the third embodiment adopts the same steps from the manufacturing process of the second embodiment while at the same time taking into account the structured planar assembly structure SPAS specific to the third embodiment.

Figure 5A:
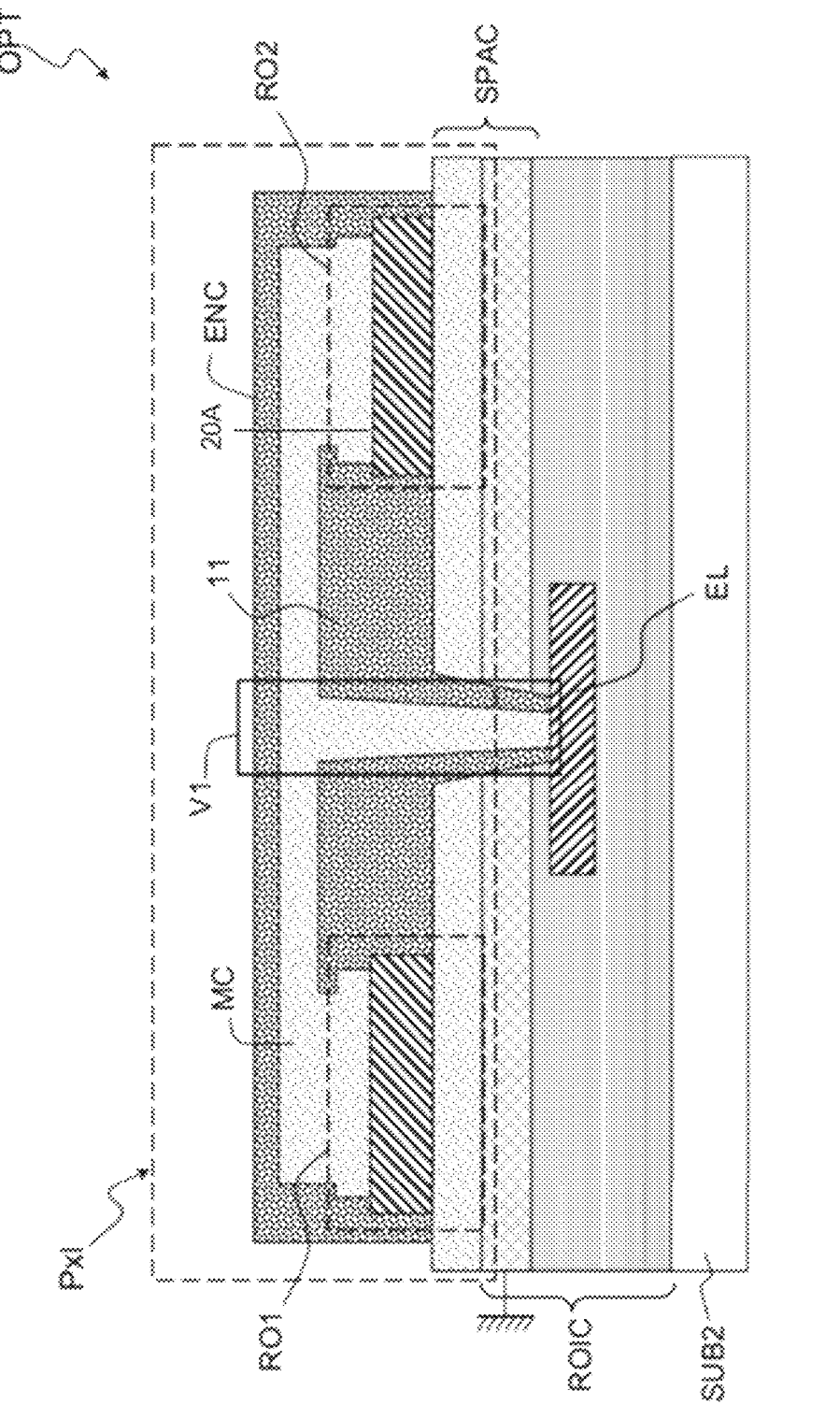
FIG. 5a illustrates a fourth embodiment of the hybridization of a pair of optical resonators of one and the same pixel belonging to a hybrid optoelectronic system.

FIG. 5a illustrates a fourth embodiment of the hybridized pixel according to the invention, which is compatible with a CMOS process.

The fourth embodiment of the pixel Pxl differs from the first embodiment by the following features:

for each optical resonator RO$_i$, the upper metal layer M2 covers part of the surface denoted 20A of the photo-detecting structure SPD, and not the entirety thereof, as in the first embodiment.

The pixel Pxl is encapsulated by an encapsulating layer ENC made of dielectric material so as to prevent copper from migrating and for example contaminating the other components of the system.

Figure 5B:
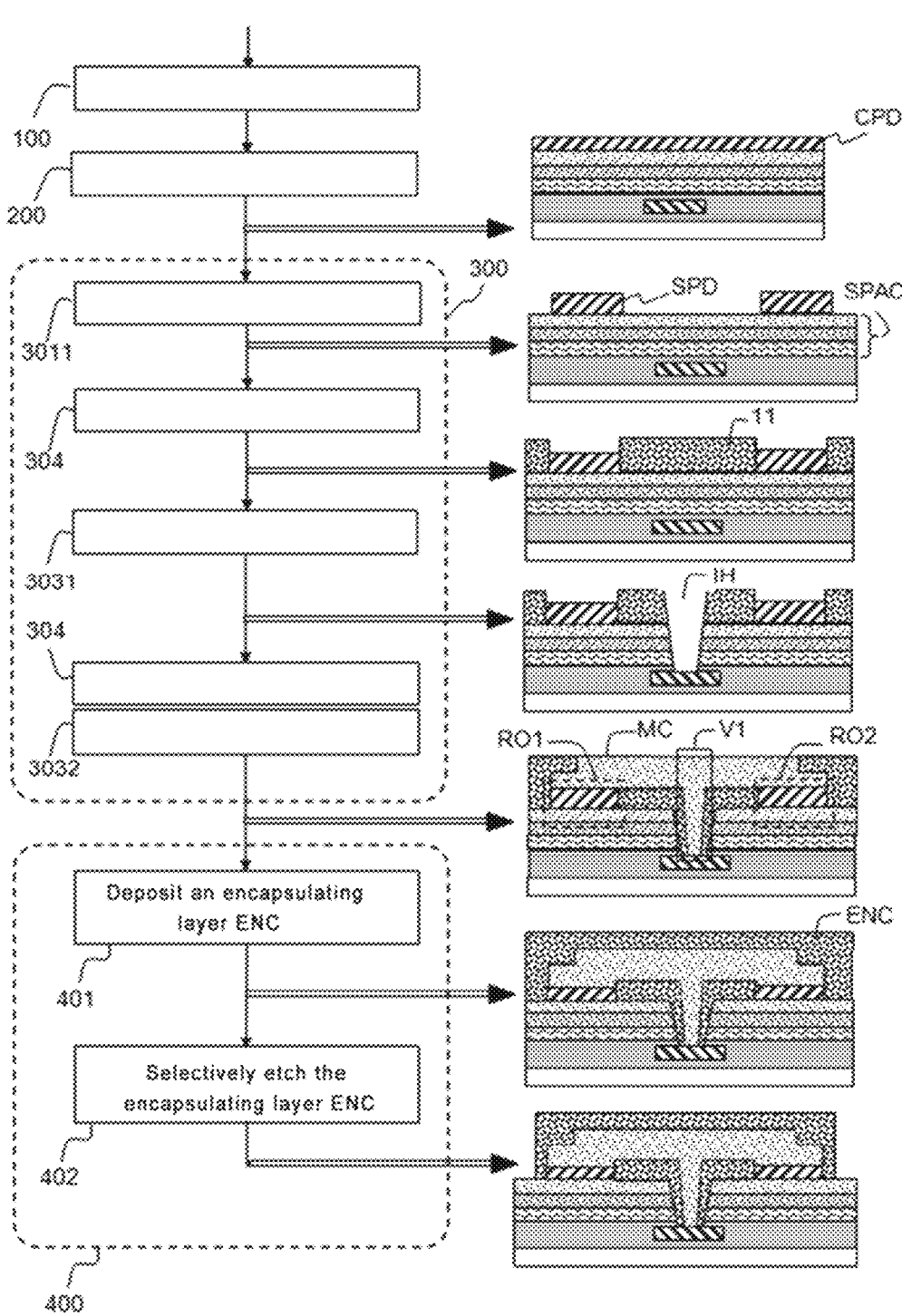
FIG. 5b illustrates a manufacturing process for hybridizing a pixel belonging to a hybrid optoelectronic system according to the fourth embodiment.

FIG. 5b illustrates a CMOS manufacturing process P3 according to the invention for producing a hybridized pixel Pxl according to the fourth embodiment.

Steps 100 and 200 are similar to the manufacturing process of FIG. 4c.

Step 300 of manufacturing and interconnecting at least one pixel Pxl adopts the same technological steps as those described for the process of FIG. 4c, but in a different order and with damascene technical steps that are compatible with a CMOS production line.

The process P3 furthermore comprises a step 400 of producing an encapsulating layer ENC made of dielectric material covering the pixel Pxl. Said encapsulation step comprises the following sub-steps:

the sub-step 401 of depositing an encapsulating layer made of dielectric material covering at least the second metal layers M2 and the connection microstructure MC.

next, the sub-step 402 of selectively etching the layer made of dielectric material deposited beforehand so as to keep at least the parts covering the upper metal layer M2, thus producing an encapsulating layer ENC as described in FIG. 5a.

Figure 5C:
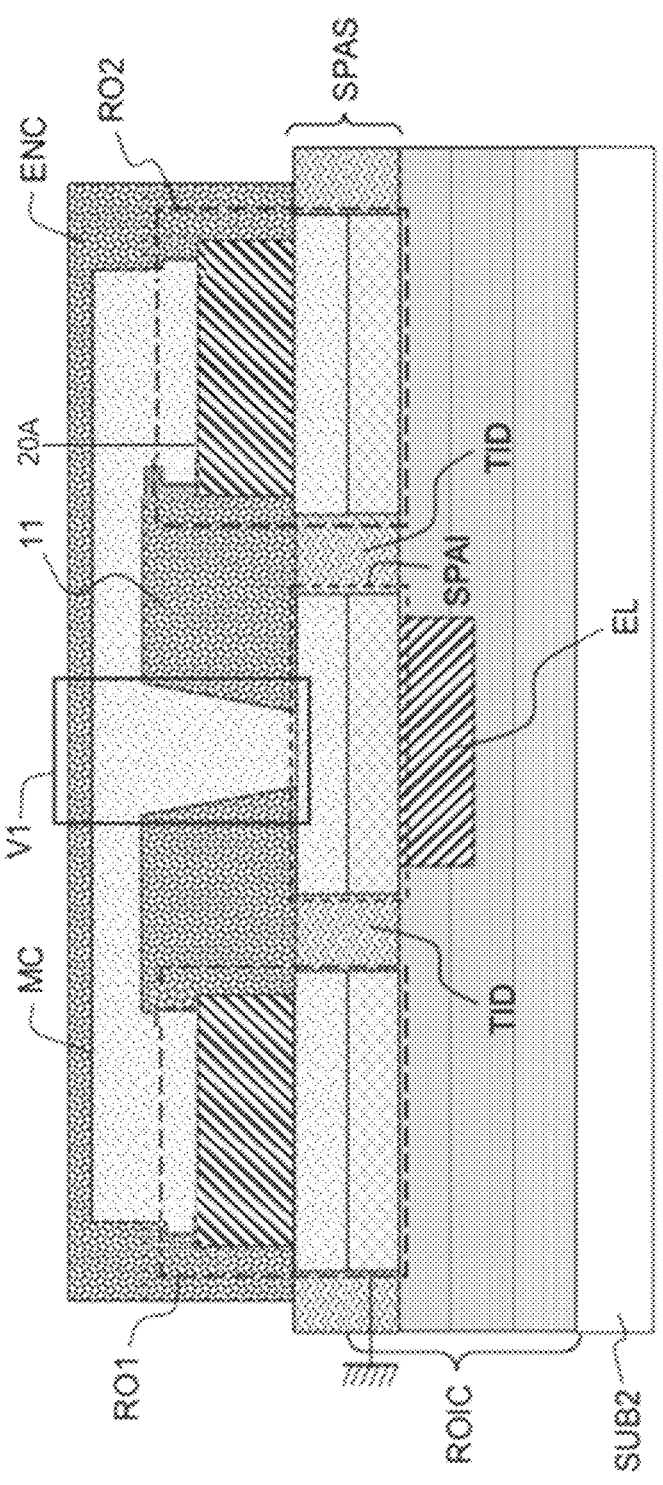
FIG. 5c illustrates a fifth embodiment of the hybridization of a pair of optical resonators of one and the same pixel belonging to a hybrid optoelectronic system.

FIG. 5c illustrates a fifth embodiment of the hybridized pixel according to the invention, which is compatible with a CMOS process. This is the equivalent of the fourth embodiment of FIG. 5a, but adopting the features of a structured planar assembly layer SPAS.

In other words, the fifth embodiment of the pixel Pxl differs from the second embodiment of FIG. 4b by the following features:

for each optical resonator RO$_i$, the upper metal layer M2 covers part of the surface denoted 20A of the photo-detecting structure SPD, and not the entirety thereof, as in the first embodiment.

The pixel Pxl is encapsulated by an encapsulating layer ENC made of dielectric material so as to prevent copper from migrating and for example contaminating the other components of the system.

Figure 6A:
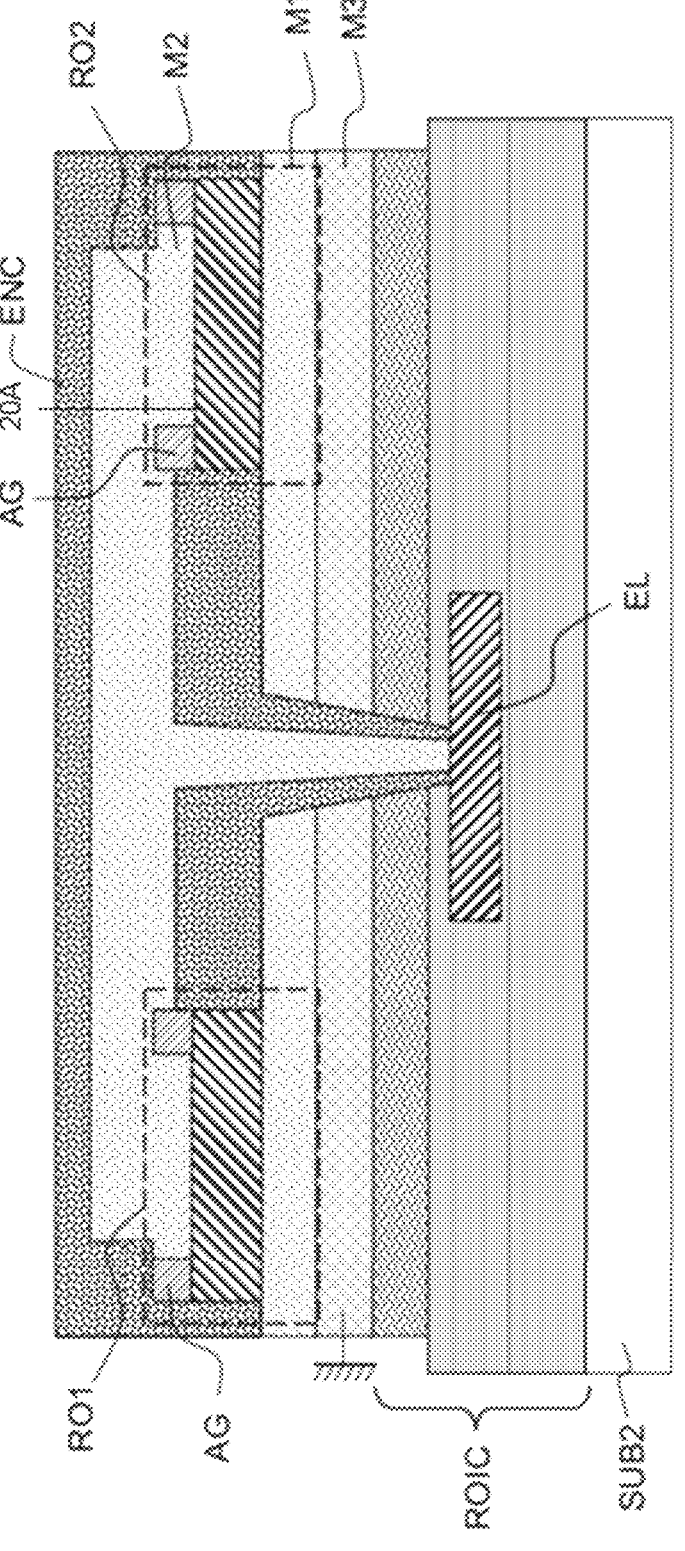
FIG. 6a illustrates a sixth embodiment of the hybridization of a pair of optical resonators of one and the same pixel belonging to a hybrid optoelectronic system.

FIG. 6a illustrates a fifth embodiment of the hybridization of a pixel belonging to a hybrid optoelectronic system, making it possible to avoid problems of over-etching on each of the photodetecting structures SPD. Indeed, the fifth embodiment of the pixel Pxl differs from the fourth embodiment by the following feature:

The upper surface of a photodetecting structure SPD is surrounded by an etch stop ring (which may also be called a polishing stop ring) AG produced with a dielectric material. This ring structure makes it possible to stop the etching of the electric passivation layer exactly on the upper surfaces 20A.

As an alternative, it is also conceivable to cover the side surfaces of a photodetecting structure with an etch stop layer AG.

The example illustrated in FIG. 6a adopts the structure of a continuous assembly layer SPAC. Without loss of generality, it is possible to integrate the solution of the etch stop ring into a pixel structure according to the invention having a structured planar assembly layer SPAS.

Figure 6B:
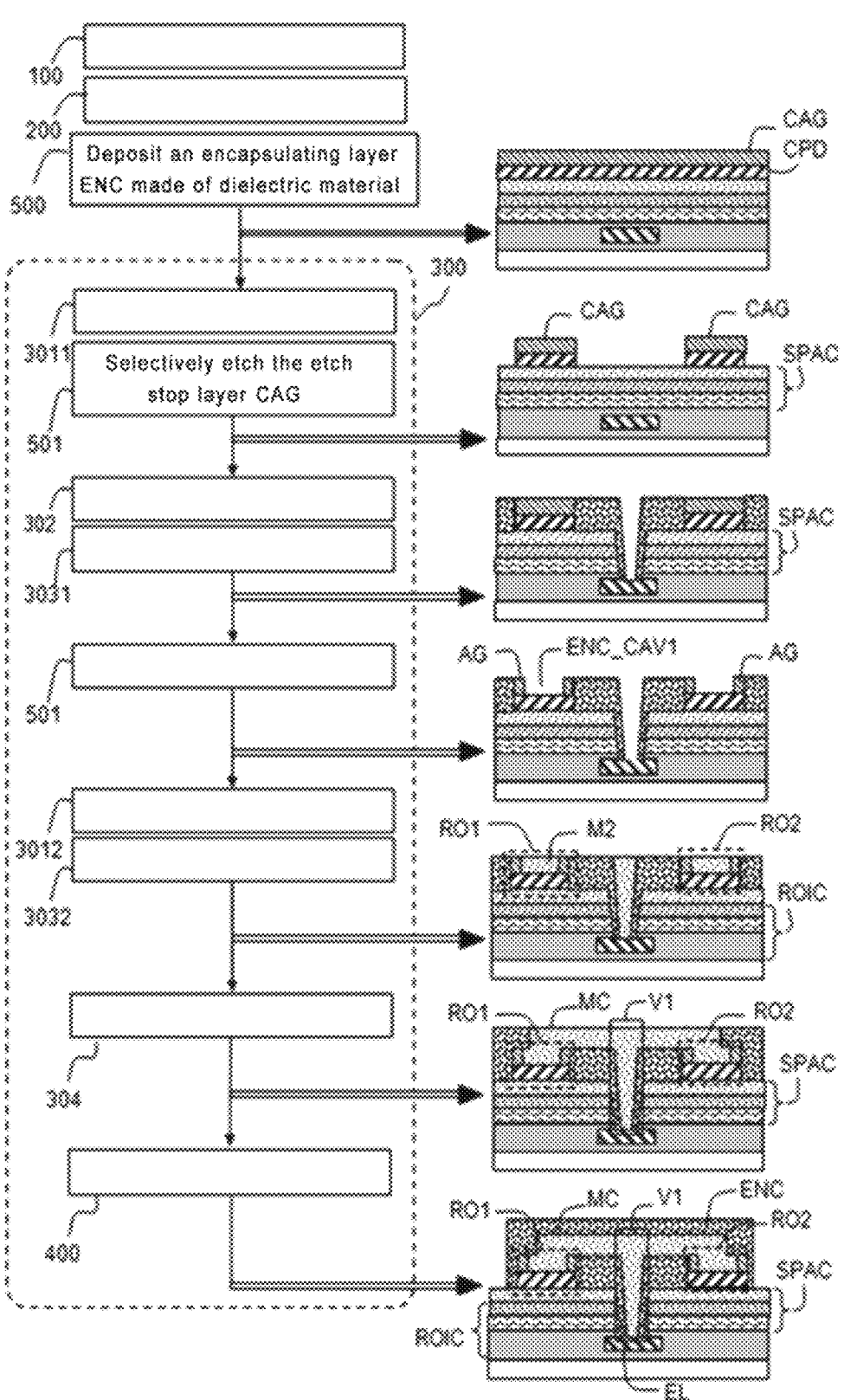
FIG. 6b illustrates a manufacturing process for hybridizing a pixel belonging to a hybrid optoelectronic system according to the sixth embodiment.

FIG. 6b illustrates a manufacturing process P4 for producing a pixel belonging to a hybrid optoelectronic system according to the fifth embodiment.

The manufacturing process P4 is a "CMOS process". The assembly step 100 and detachment step 200 are similar to the processes P1 and P2 described above.

In the process P4, the third step 500 consists in depositing an etch stop layer CAG (which may also be called a polishing stop layer) on the photodetecting layer CPD prior to the step 300 of producing and connecting a pixel Pxl to the associated buried electrode EL.

The step 300 of producing and connecting the pixel Pxl comprises a succession of sub-steps that are compatible with a "CMOS" process.

The first step 3011 of producing the photodetecting structures SPD is similar to that of P3 described above.

The second step 501 consists in selectively etching the etch stop layer CAG so as to keep only the parts resting on the upper surface 20A of each photodetecting structure SPD.

The third step 302 consists in producing the support 11, followed by a fourth step 3031 of producing the via holes IH in a manner similar to the process P3.

The fourth step 501 consists in reiterating selective etching of what remains of the etch stop layer CAG so as to produce, on each photodetecting structure SPD, an etch stop ring AG (or polishing stop ring) centered on the surface 20A.

The fifth metal deposition step 3032 simultaneously fills the via hole IH so as to form the via V1 and fills the internal cavity of the etch stop rings AG so as to form 3012 the second upper layers M2 of each optical resonator RO$_i$.

The sixth step 304 consists in depositing a layer of conductive material on the support 11 so as to connect the optical resonators RO$_i$ to one another.

The last step 400 is a step of encapsulating the pixel that is obtained, similar to that of the process of FIG. 6b.

Figure 7A:
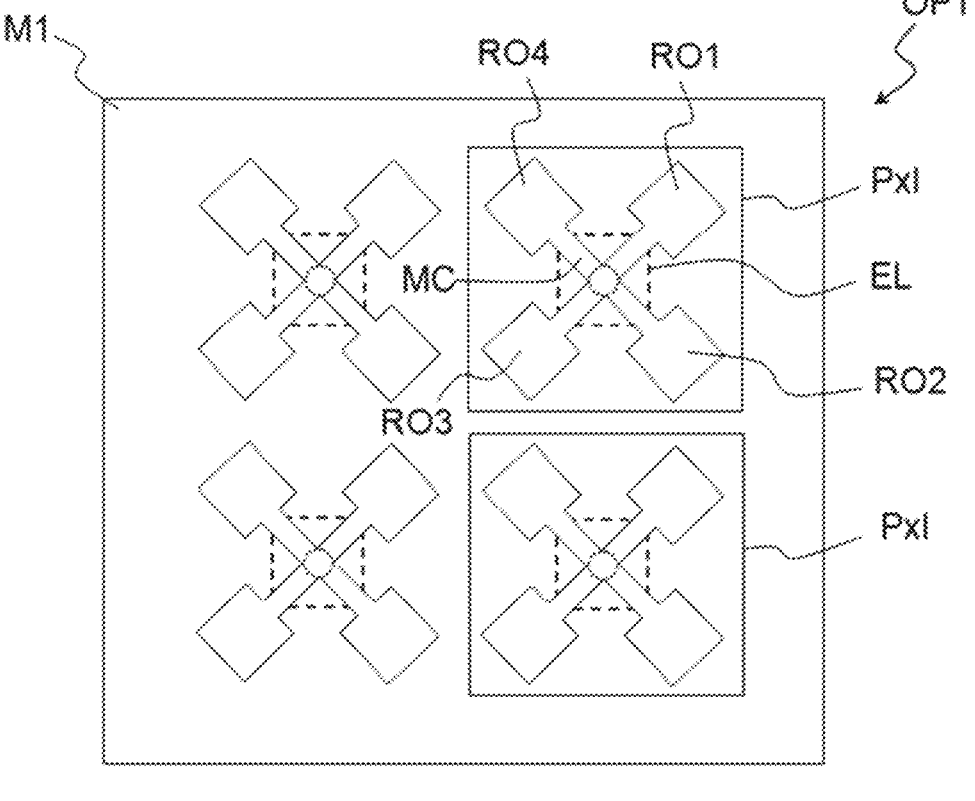
FIG. 7a shows a plan view of one example of an optoelectronic device comprising multiple pixels according to the invention.
Figure 7B:
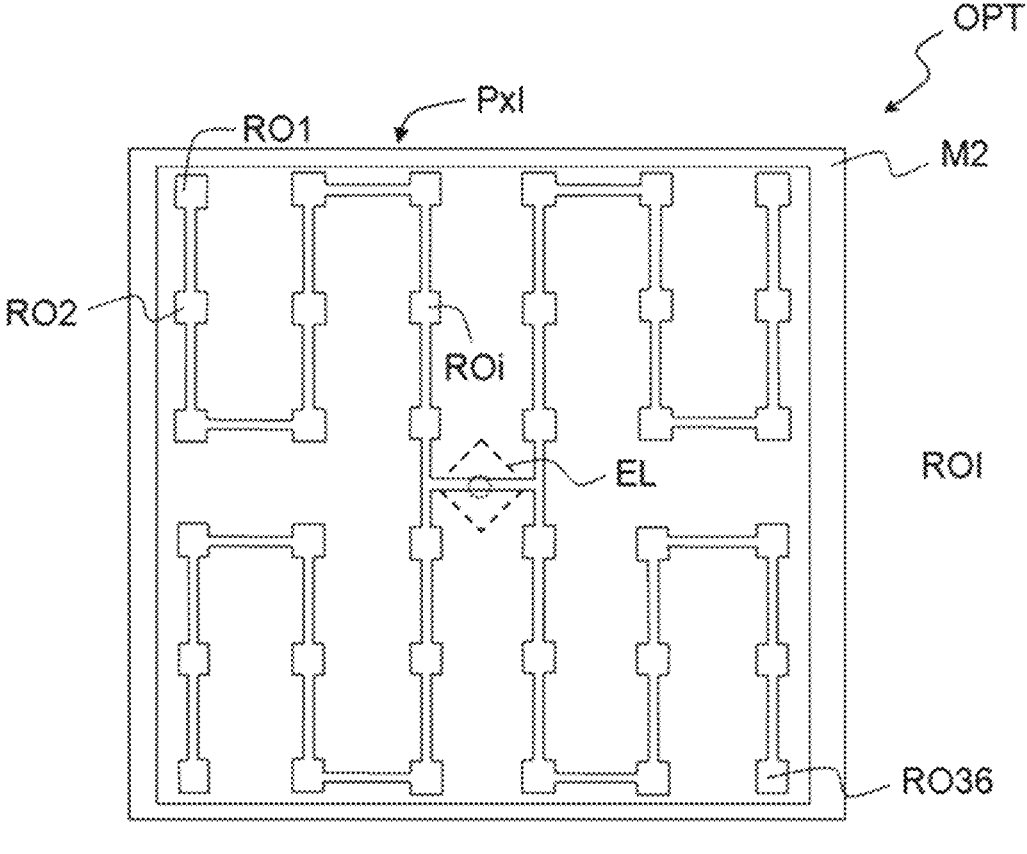
FIG. 7b shows a plan view of one example of an optoelectronic device comprising a single pixel according to the invention.

FIGS. 7a and 7b illustrate alternative embodiments of an optoelectronic device OPT comprising at least one pixel Pxl. FIG. 7a illustrates 4 pixels, such that each one comprises 4 optical resonators. The four resonators are connected via a star-shaped connection microstructure produced by the manufacturing process according to the invention. FIG. 7b illustrates one example of an optoelectronic device comprising a single pixel consisting of 36 optical resonators that are connected to one another via a microstructure produced according to the invention.

The architecture of pixels according to the invention, based on optical resonators that are interconnected and integrated with readout circuits according to the invention, thus presents a new solution for producing matrix image sensors, having the following technical advantages:

a compact pixel matrix architecture, making it possible to achieve a high resolution.

an overall system with reduced volume in comparison with imagers from the prior art by virtue of the direct assembly between optical part and electrical part.

improved optical performance, implementing the advantages of optical resonators.

a reduction in dark noise by virtue of limiting the surface of photodetecting regions made of semiconductor materials.

To conclude, the described invention makes it possible to hybridize an optoelectronic system having at least one pixel comprising a plurality of MIM optical resonators. The pixelation and interconnection of a pixel is achieved by way of a connection via for connecting the optical resonators belonging to the pixel to the buried readout electrode belonging to the readout circuit ROIC. A number of embodiments of the structure of a pixel according to the invention have been described by way of indication without loss of generality. The described invention also makes it possible to carry out a manufacturing process for each embodiment. Processes according to the invention are compatible with a "III-V process" production line. Other processes according to the invention are compatible with a "CMOS process" production line.

The invention claimed is:

1. An optoelectronic device (OPT) comprising:
at least one pixel (Pxl), a pixel comprising:
a plurality of optical resonators (RO$_1$, RO$_2$), each optical resonator comprising a photodetecting structure (SPD) confined between a first, reflective, metal layer (M1) and a second metal layer (M2);
and a connection microstructure (MC) that is arranged on a support made of dielectric material and is configured to electrically interconnect the second metal layers (M2) of the optical resonators (RO$_1$, RO$_2$) belonging to the same pixel (Pxl);
a readout integrated circuit (ROIC) arranged on a substrate (Sub2) and assembled with said pixel; the readout integrated circuit comprising a buried readout electrode (EL) associated with said pixel (Pxl) and a metal or dielectric outer layer (M3, D2);
the assembly comprising at least the first metal layer (M1) and the outer layer (M3) of the readout integrated circuit being referred to as planar assembly structure (SPA);
the second metal layers (M2) of the resonators (RO$_1$, RO$_2$) of a pixel (Pxl) being connected to the associated readout electrode (EL) by way of a metal via (V1) connected to the connection microstructure (MC) and passing through the support.

2. The optoelectronic device (OPT) as claimed in claim 1, wherein at least one dimension of a resonator (RO$_i$), chosen from among width and length, is within the interval [λ/2n−50%; λ/2n+50%], where:
λ is an incident wavelength;
n is an effective refractive index of the photodetecting structure (SPD).

3. The optoelectronic device (OPT) as claimed in claim 1, wherein the height of the photodetecting structure (SPD) is within the interval [λ/4n−50%; λ/2n+50%], where:
λ is an incident wavelength;
n is an effective refractive index of the photodetecting structure (SPD).

4. The optoelectronic device (OPT) as claimed in claim 1, wherein the distance between two adjacent pixels (Pxl) is greater than or equal to the wavelength absorbed by an optical resonator (RO$_1$, RO$_2$) divided by twice the effective refractive index of the photodetecting structure (SPD).

5. The optoelectronic device (OPT) as claimed in claim 1, wherein the metal via (V1) is electrically isolated from the reflective metal layers (M1) of the resonators (RO$_1$, RO$_2$) of said pixel (Pxl).

6. The optoelectronic device (OPT) as claimed in claim 1, wherein the second metal layer (M2) covers the entire surface (20A) of the photodetecting structure (SPD).

7. The optoelectronic device (OPT) as claimed in claim 1, wherein the second metal layer (M2) covers part of the surface (20A) of the photodetecting structure (SPD); the second metal layer (M2) being fully covered by an encapsulating layer made of dielectric material (ENC).

8. The optoelectronic device (OPT) as claimed in claim 7, furthermore comprising an etch stop ring (AG) made of a dielectric material arranged on the surface (20A) of the photodetecting structure (SPD).

9. The optoelectronic device (OPT) as claimed in claim 1, wherein: the outer layer of the readout integrated circuit (ROIC) is a metal layer (M3) common to all of the resonators (RO$_1$, RO$_2$) of said at least one pixel (Pxl), and to all of the pixels (Pxl) where applicable, said metal outer layer (M3) being connected to electrical ground;

the reflective metal layer (M1) is common to all of the resonators (RO$_1$, RO$_2$) of said at least one pixel (Pxl), and to all of the pixels (Pxl) where applicable;

and the metal via (V1) passes through said assembly structure (SPA) and part of the readout integrated circuit (ROIC) to the readout electrode (EL).

10. The optoelectronic device (OPT) as claimed in claim 1, wherein the planar assembly structure (SPA) is structured so as to form individualized elementary assembly structures (SPAI) for each electrode (EL); said elementary assembly structures (SPAI) being electrically isolated from one another;

an elementary assembly structure (SPAI) associated with an electrode (EL) of a pixel (Pxl) being electrically connected to said electrode (EL) and to the metal via (V1) of said pixel (Pxl).

11. A matrix image sensor comprising an optoelectronic device (OPT) as claimed in claim 1.

12. A process for manufacturing an optoelectronic device (OPT), the process comprising the steps of:

assembling a first planar structure (S1) comprising a first substrate (Sub1), an assembly of at least one photodetecting layer (CPD) and a first reflective metal layer (M1), on the one hand;

and a readout integrated circuit (ROIC) deposited on a second substrate (Sub2) and comprising at least one buried readout electrode (EL) and a metal or dielectric outer layer (M3), on the other hand;

the assembly comprising at least the first metal layer (M1) and the outer layer (M3, D2) of the readout integrated circuit (ROIC) forming a planar assembly structure (SPA), the planar assembly structure (SPA) being either continuous (SPAC) or structured (SPAS) and comprising individualized elementary assembly structures (SPAI) that are electrically isolated from one another;

when the planar assembly structure (SPAC) is continuous, the buried readout electrode (EL) is electrically isolated from the continuous planar assembly structure (SPAC);

when the planar assembly structure (SPAS) is structured, the buried readout electrode (EL) is electrically connected to an elementary assembly structure:

detaching the first substrate (Sub1);

producing at least one pixel (Pxl) associated with a buried electrode (EL), comprising the sub-steps of:

producing a plurality of optical resonators (RO$_i$) by:

selectively etching each of the layers of said assembly of at least one photodetecting layer (CPD) to produce a plurality of photodetecting structures (SPD);

depositing a second metal layer (M2) on each photodetecting structure (SPD);

when the planar assembly structure (SPAS) is structured, the photodetecting structure (SPD) is located facing an individualized elementary assembly structure (SPAI);

producing a support made of dielectric material between the resonators and connecting said optical resonators (RO$_i$) to one another by way of a connection microstructure (MC) arranged on said support;

producing a metal via (V1) passing through the support so as to connect the second metal layers (M2) of the resonators to the associated buried electrode (EL) via the connection microstructure (MC).

13. The process for manufacturing an optoelectronic device (OPT) as claimed in claim 12, wherein, when the planar assembly structure (SPAC) is continuous, the step of producing the metal via (V1) comprises the sub-steps of:

etching a via hole (IH) passing through the assembly structure (SPAC) to the buried electrode (EL);

filling the via hole (IH) with a conductive material in order to electrically connect the second metal layers (M2) to the buried electrode (EL);

the step of producing the support being such that said support does not cover the via hole (IH).

14. The process for manufacturing an optoelectronic device (OPT) as claimed in claim 12, wherein, when the planar assembly structure (SPAS) is structured, the step of producing the metal via (V1) comprises the sub-steps of:

etching a via hole (IH) passing through the support to the elementary assembly structure (SPAI) connected to the buried electrode (EL);

filling the via hole (IH) with a conductive material in order to electrically connect the second metal layers (M2) to the elementary assembly structure (SPAI) connected to the buried electrode (EL).

15. The process for manufacturing an optoelectronic device (OPT) as claimed in claim 12, furthermore comprising a step of encapsulating the pixel (Pxl), comprising the following sub-steps:

depositing an encapsulating layer made of dielectric material (ENC) covering the second metal layers (M2) and the connection microstructure (MC);

selectively etching the encapsulating layer (ENC) so as to retain at least the parts covering the first metal layer (M1) and the connection microstructure (MC).

16. The process for manufacturing an optoelectronic device (OPT) as claimed in claim 15, comprising:

a step of depositing an etch stop layer (CAG) on an outer layer of said assembly of at least one photodetecting layer (CPD) prior to the step of producing at least one pixel (Pxl) associated with a buried electrode (EL);

and wherein the step of producing at least one pixel (Pxl) furthermore comprises the following sub-steps:

selectively etching the etch stop layer (CAG) so as to produce, for each resonator, an etch stop ring (AG) arranged on part of the surface of the photodetecting structure (SPD) serving to contain the first metal layer (M1).

17. The process for manufacturing an optoelectronic device (OPT) as claimed in claim 15, wherein the conductive material deposited to produce the second metal layer (M2) and the metal via (V1) is copper or aluminum or tungsten.

18. The process for manufacturing an optoelectronic device (OPT) as claimed in claim 12, wherein the conductive material deposited to produce the second metal layer (M2) and the metal via (V1) is gold or titanium or platinum.

19. The process as claimed in claim 12, wherein the step of producing a plurality of optical resonators ($RO_i$) and the step of producing the metal via (V1) are carried out by lithography then etching, the lithography technology being chosen from among: electron beam; nanoprinting; optical lithography, and the etching technology being chosen from among ion etching, chemical etching or plasma.

* * * * *